(12) United States Patent
Izumi et al.

(10) Patent No.: US 7,875,483 B2
(45) Date of Patent: Jan. 25, 2011

(54) MANUFACTURING METHOD OF MICROELECTROMECHANICAL SYSTEM

(75) Inventors: Konami Izumi, Kanagawa (JP); Mayumi Yamaguchi, Kanagawa (JP); Fuminori Tateishi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1049 days.

(21) Appl. No.: 11/462,225

(22) Filed: Aug. 3, 2006

(65) Prior Publication Data

US 2007/0037311 A1 Feb. 15, 2007

(30) Foreign Application Priority Data

Aug. 10, 2005 (JP) ............... 2005-232670

(51) Int. Cl.
*H01L 21/00* (2006.01)
(52) U.S. Cl. ................... 438/52; 257/E29.324
(58) Field of Classification Search ............ 438/52
See application file for complete search history.

(56) References Cited

U.S. PATENT DOCUMENTS 6,495,387 B2 * 12/2002 French .................. 438/52

2002/0025591 A1 * 2/2002 Ohnuma et al. ............... 438/30
2005/0034822 A1 2/2005 Kim et al.
2006/0014335 A1 1/2006 Ohnuma et al.

FOREIGN PATENT DOCUMENTS

| EP | 1 471 637 A2 | 10/2004 |
|---|---|---|
| JP | 2002-151523 | 5/2002 |
| JP | 2004-328745 | 11/2004 |

* cited by examiner

*Primary Examiner*—Alexander G Ghyka
(74) *Attorney, Agent, or Firm*—Fish & Richardson P.C.

(57) ABSTRACT

To provide a method of easily forming a three-dimensional structure typified by a cantilever by using a thin film formed over an insulating surface, and provide a microelectromechanical system formed by such a method. A three-dimensional structure typified by a cantilever is formed by using a mask having a nonuniform thickness. Specifically, a microstructure is manufactured by processing a structural layer formed over a sacrificial layer by using a mask having a nonuniform thickness and then removing the sacrificial layer. The sacrificial layer can be formed by using a silicon layer or a metal layer.

20 Claims, 21 Drawing Sheets first region 251 | second region 252 weight region   movable region   weight region openings 801

MANUFACTURING METHOD OF MICROELECTROMECHANICAL SYSTEM

BACKGROUND OF THE INVENTION

Field of the Invention

The present invention relates to a manufacturing method of a microelectromechanical system formed over an insulating substrate.

In recent years, research of micromechanical systems called MEMS has been actively advanced. MEMS (MicroElectroMechanical System) is an abbreviation of a microelectromechanical system, and also simply called a micromachine. In general, a micromachine means a microdevice formed by integrating a "movable microstructure with a three-dimensional structure" with an "electronic circuit having a semiconductor element" by using a semiconductor microfabrication technique. The microstructure is different from a semiconductor element in that it has a three-dimensional structure and a movable portion.

As one of such micromachines, there is a cantilever. A cantilever is used as an air-gap piezoelectric thin film resonator element (see Reference 1: Japanese Patent Laid-Open No. 2004-328745).

Reference 1 discloses a manufacturing method of a cantilever-shaped FBRA (Film Bulk Acoustic Resonator) using a simplified process, which includes the step of forming an air gap by etching a sacrificial layer. A bottom electrode is constructed from a supporting portion and a projecting portion which makes a direct contact with a sacrificial layer, and the supporting portion and the projecting portion are connected in a cantilever shape.

In addition, a photolithography process is known as a method for forming a gate electrode of a semiconductor device having a display portion, with the use of a photomask or a reticle having an auxiliary pattern which is formed of a diffraction grating pattern or a semi-transmissive film having a function of reducing the light intensity (see Reference 2: Japanese Patent Laid-Open No. 2002-151523).

According to Reference 2, a transistor with an LDD (Lightly Doped Drain) structure, a GOLD (Gate-drain Overlapped LDD) structure, or a single-drain structure can be easily formed for each circuit by using an auxiliary pattern which is formed of a diffraction grating pattern or a semi-transmissive film having a function of reducing the light intensity.

A conventional manufacturing method of a cantilever is complex, and involves a large number of manufacturing steps. This results from the complex manufacturing steps of a unique three-dimensional structure of a cantilever having irregularities.

According to the method disclosed in Reference 1, a top electrode is formed in a region serving as a weight of a structural layer with a cantilever shape, and a unique three-dimensional structure is formed by stacking different materials. In addition, Reference 1 discloses only a process of manufacturing a cantilever by using a silicon wafer. A silicon wafer is expensive and has a circular shape; therefore, it has restrictions in the number of devices that can be manufactured out of one silicon wafer in the case of forming a plurality of elements, and thus has limitations in cost reduction.

SUMMARY OF THE INVENTION

In view of the foregoing, it is an object of the invention to provide a method for easily forming a three-dimensional structure typified by a cantilever over an insulating surface, which differs from the methods disclosed in the aforementioned references, and provide a microelectromechanical system formed by such a method.

In order to achieve the aforementioned object, the invention has a feature that a three-dimensional structure typified by a cantilever is formed by using a mask having a nonuniform thickness.

Specific structures of the invention are shown below.

One aspect of the invention is a manufacturing method of a microelectromechanical system, which includes the steps of: forming a sacrificial layer; forming a first layer over the sacrificial layer; forming a mask having a first thickness and a second thickness over the first layer; etching the first layer by using the mask to form a structural layer; and removing the sacrificial layer.

One aspect of the invention is a manufacturing method of a microelectromechanical system, which includes the steps of: forming a sacrificial layer; forming a first layer over the sacrificial layer; forming a mask having a first thickness and a second thickness over the first layer; etching the first layer by using the mask to form a structural layer; and removing the sacrificial layer. A portion of the structural layer provided below the mask with the second thickness is thinner than a portion of the structural layer provided below the mask with the first thickness.

One aspect of the invention is a manufacturing method of a microelectromechanical system, which includes the steps of: forming a sacrificial layer; forming a first layer over the sacrificial layer; forming a mask having a first thickness and a second thickness over the first layer; etching the first layer by using the mask to form a structural layer; and removing the sacrificial layer. A portion of the structural layer provided below the mask with the second thickness is thinner than a portion of the structural layer provided below the mask with the first thickness, so that a three-dimensional structure is formed. A portion of the three-dimensional structure provided below the mask with the first thickness functions as a weight One aspect of the invention is a manufacturing method of a microelectromechanical system, which includes the steps of: forming a sacrificial layer; forming an amorphous silicon layer over the sacrificial layer; forming a polycrystalline silicon layer by crystallizing the amorphous silicon layer using a metal; forming a mask having a first thickness and a second thickness over the polycrystalline silicon layer; etching the polycrystalline silicon layer by using the mask to form a structural layer; and removing the sacrificial layer.

One aspect of the invention is a manufacturing method of a microelectromechanical system, which includes the steps of: forming a sacrificial layer; forming an amorphous silicon layer over the sacrificial layer; forming a polycrystalline silicon layer by crystallizing the amorphous silicon layer using a metal; forming a mask having a first thickness and a second thickness over the polycrystalline silicon layer; etching the polycrystalline silicon layer by using the mask to form a structural layer; and removing the sacrificial layer. A portion of the structural layer provided below the mask with the second thickness is thinner than a portion of the structural layer provided below the mask with the first thickness One aspect of the invention is a manufacturing method of a microelectromechanical system, which includes the steps of: forming a sacrificial layer; forming an amorphous silicon layer over the sacrificial layer; forming a polycrystalline silicon layer by crystallizing the amorphous silicon layer using a metal; forming a mask having a first thickness and a second thickness over the polycrystalline silicon layer; etching the polycrystalline silicon layer by using the mask to form a structural layer; and removing the sacrificial layer. A portion of the structural layer provided below the mask with the second thickness is thinner than a portion of the structural layer provided below the mask with the first thickness, so that a three-dimensional structure is formed. A portion of the three-dimensional structure provided below the mask with the first thickness functions as a weight.

In the invention, an amorphous silicon layer can be used as a sacrificial layer.

One aspect of the invention is a manufacturing method of a microelectromechanical system, which includes the steps of: forming a semiconductor layer to be a semiconductor element over a first region of an insulating substrate; forming a sacrificial layer over a second region of the insulating substrate; forming a conductive layer over the semiconductor layer and the sacrificial layer; forming a first mask and a second mask each having a first thickness and a second thickness over the conductive layer; etching the conductive layer by using the first mask and the second mask; and removing the sacrificial layer. A portion of the conductive layer provided below the first mask with the second thickness is thinner than a portion of the conductive layer provided below the first mask with the first thickness, and a portion of the conductive layer provided below the second mask with the second thickness is thinner than a portion of the conductive layer provided below the second mask with the first thickness.

One aspect of the invention is a manufacturing method of a microelectromechanical system, which includes the steps of: forming a semiconductor layer to be a semiconductor element over a first region of an insulating substrate; forming a sacrificial layer over a second region of the insulating substrate; forming a conductive layer over the semiconductor layer and the sacrificial layer; applying a mask material onto the conductive layer; forming a first mask and a second mask each having a first thickness and a second thickness by using the mask material; etching the conductive layer by using the first mask and the second mask; and removing the sacrificial layer. A portion of the conductive layer provided below the first mask with the second thickness is thinner than a portion of the conductive layer provided below the first mask with the first thickness, and a portion of the conductive layer provided below the second mask with the second thickness is thinner than a portion of the conductive layer provided below the second mask with the first thickness.

One aspect of the invention is a manufacturing method of a microelectromechanical system, which includes the steps of: forming a semiconductor layer to be a semiconductor element over a first region of an insulating substrate; forming a sacrificial layer over a second region of the insulating substrate; forming a conductive layer over the semiconductor layer and the sacrificial layer; forming a first mask and a second mask each having a first thickness and a second thickness over the conductive layer; etching the conductive layer by using the first mask and the second mask, thereby forming a gate electrode of the semiconductor element in the first region and forming a structural layer in the second region; and removing the sacrificial layer. A portion of the conductive layer provided below the first mask with the second thickness is thinner than a portion of the conductive layer provided below the first mask with the first thickness, and a portion of the conductive layer provided below the second mask with the second thickness is thinner than a portion of the conductive layer provided below the second mask with the first thickness, so that a three-dimensional structure is formed. A portion of the three-dimensional structure provided below the mask with the first thickness functions as a weight.

One aspect of the invention is a manufacturing method of a microelectromechanical system, which includes the steps of: forming a semiconductor layer to be a semiconductor element over a first region of an insulating substrate; forming a sacrificial layer over a second region of the insulating substrate; forming a conductive layer over the semiconductor layer and the sacrificial layer; forming a first mask and a second mask each having a first thickness and a second thickness over the conductive layer; etching the conductive layer by using the first mask and the second mask, thereby forming a gate electrode of the semiconductor element in the first region and forming a structural layer in the second region; forming an impurity region in the semiconductor layer by using the gate electrode; forming a wire connected to the impurity region and the structural layer; and removing the sacrificial layer. A portion of the conductive layer provided below the first mask with the second thickness is thinner than a portion of the conductive layer provided below the first mask with the first thickness, and a portion of the conductive layer provided below the second mask with the second thickness is thinner than a portion of the conductive layer provided below the second mask with the first thickness.

In the invention, the mask with the second thickness is thicker than the mask with the first thickness.

In the invention, the mask with the second thickness is formed by using a photomask or a reticle having an auxiliary pattern which is formed of a diffraction grating pattern or a semi-transmissive film having a function of reducing the light intensity.

In the invention, the mask with the first thickness is formed by using a photomask or a reticle having a mask pattern with a uniform thickness, while the mask with the second thickness is formed by using a photomask or a reticle having a mask pattern which is deliberately formed to have a nonuniform thickness.

The invention provides a microelectromechanical system formed by the aforementioned method.

In the invention, a microstructure can be manufactured over an insulating substrate by using a mask having a non-uniform thickness compared with a thin film typified by a silicon layer. As a result, a microstructure with a three-dimensional structure can be easily manufactured.

A microstructure of the invention can be formed over the same insulating substrate as a semiconductor element. As a result, a connection defect between a microstructure and a semiconductor element can be reduced to increase the mass productivity.

The microstructure of the invention can be used as a switch, and such a switch can be formed to be thinner and manufactured at lower cost, compared with a switch formed from a silicon wafer.

BRIEF DESCRIPTION OF THE DRAWINGS

In the accompanying drawings.

DETAILED DESCRIPTION OF THE INVENTION

Figure 1A:
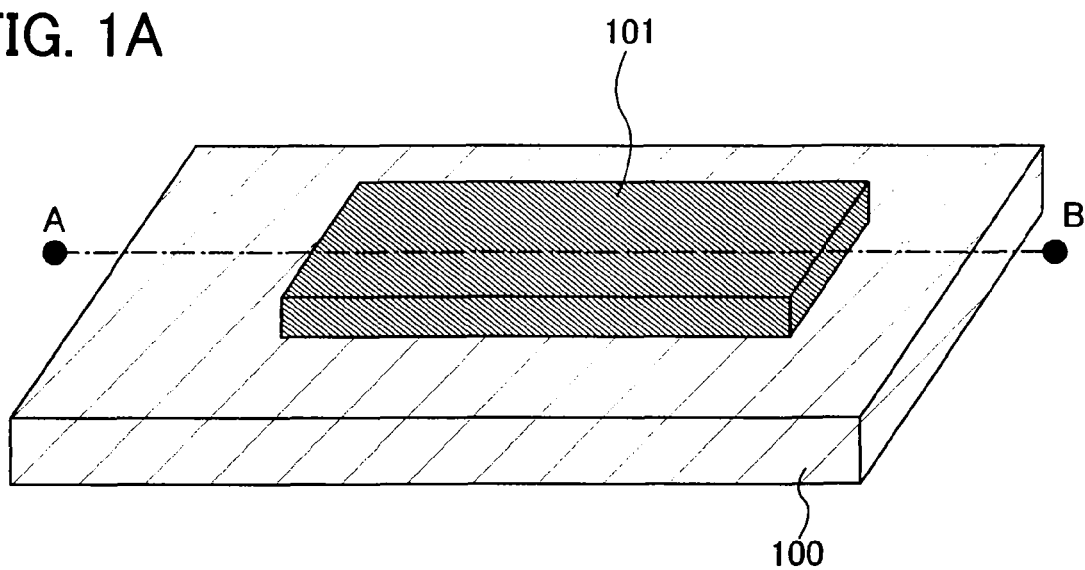
FIGS. 1A and 1B illustrate a manufacturing process of a microstructure of the invention.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that common portions or portions having a similar function are denoted by common reference numerals in all the drawings for illustrating embodiment modes, and thus their description will be made only once.

EMBODIMENT MODE 1

In this embodiment mode, description is made of a manufacturing method of a microstructure formed by using a mask having a nonuniform thickness. In this embodiment mode, a mask is processed by photolithography using a photomask or a reticle having an auxiliary pattern which is formed of a diffraction grating pattern or a semi-transmissive film having a function of reducing the light intensity.

Figure 1B:
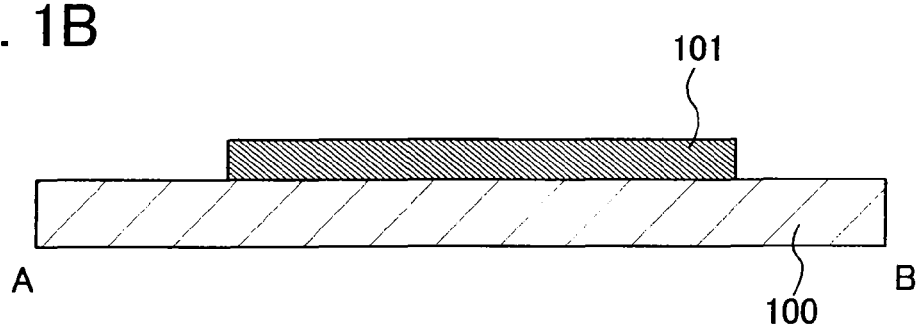

As shown in FIG. 1A, a substrate 100 having an insulating surface (hereinafter referred to as an insulating substrate) 100 is prepared. Note that FIG. 1B shows a cross section along a line A-B in FIG. 1A.

As the insulating substrate 100, a glass substarte, a quartz substrate, a plastic substrate, or the like can be used. For example, when a microstructure is formed over a plastic substarte, a device having a thin and highly flexible microstrure can be formed. In addition, when a glass substrate which is thinned by polishing or the like is used, a thin device can be formed. Further, a microstructure of the invention can also be formed over a conductive substrate made of metal or the like or a semiconductive substarte made of silicon or the like which has an insulating layer on its surface.

A sacrificial layer 101 is formed over the insulating substrate 100. Note that the sacrificial layer means a layer which is selectively removed in a later process. Therefore, the sacrificial layer may be either a conductive layer or an insulating layer as long as it can be removed. By removing such a sacrificial layer, an air gap is produced. That is, a structure with a predetermined shape can be formed in the air gap. The sacrificial layer 101 can be formed from a material containing metals such as titanium (Ti), aluminum (Al), molybdenum (Mo), or tungsten (W), or also can be formed from a semiconductor layer containing silicon (also referred to as a silicon layer), or a material such as oxide of silicon (silicon oxide) or nitride of silicon (silicon nitride). Alternatively, the sacrificial layer 101 can be formed from a metal compound which is a compound of the aforementioned metal and silicon. In addition, the sacrificial layer 101 may be formed to have either a single-layer structure or a stacked structure. In the case of a stacked structure, a material selected from the aforementioned materials may be stacked.

The sacrificial layer 101 can be formed by sputtering, CVD, or the like. Then, the sacrificial layer 101 can be processed by forming a resist mask using photolithography and performing dry etching thereto. In addition, the sacrificial layer 101 can be formed by a droplet discharge method typified by an ink-jet deposition method. In the case of using the droplet discharge method, the sacrificial layer 101 can be formed selectively by dropping a solvent in which the aforementioned metal is mixed. Therefore, a photolithography process and a patterning process of the sacrificial layer 101 can be omitted. As a result, waste of resist materials and the process time can be reduced.

If the sacrificial layer 101 is formed to be too thin, a phenomenon that an etchant cannot be diffused, which would prevent etching of the sacrificial layer 101, or a phenomenon that the structural layer buckles (a microstructure adheres to a lower surface) after etching occurs. On the other hand, if the sacrificial layer 101 is formed to be too thick and in the case of electrostatically driving a microstructure by utilizing an air gap which is produced after removing the sacrificial layer, it becomes difficult to drive the microstructure because of a long distance of the air gap. Accordingly, in the case where a microstructure is used as a switching element which is driven electrostatically, the thickness of the sacrificial layer 101 is preferably from 0.5 to 4 µm. It is needless to mention that the material of the sacrificial layer 101 needs to be considered in order to obtain such a thickness. The thickness of the sacrificial layer 101 can be the height of the air gap.

In this embodiment mode, the sacrificial layer 101 is formed by CVD, using a silicon layer. After that, a mask is formed thereover by photolithography and the sacrificial layer 101 is etched by using the mask. In this embodiment mode, the sacrificial layer 101 is etched into a rectangular shape.

Figure 2A:
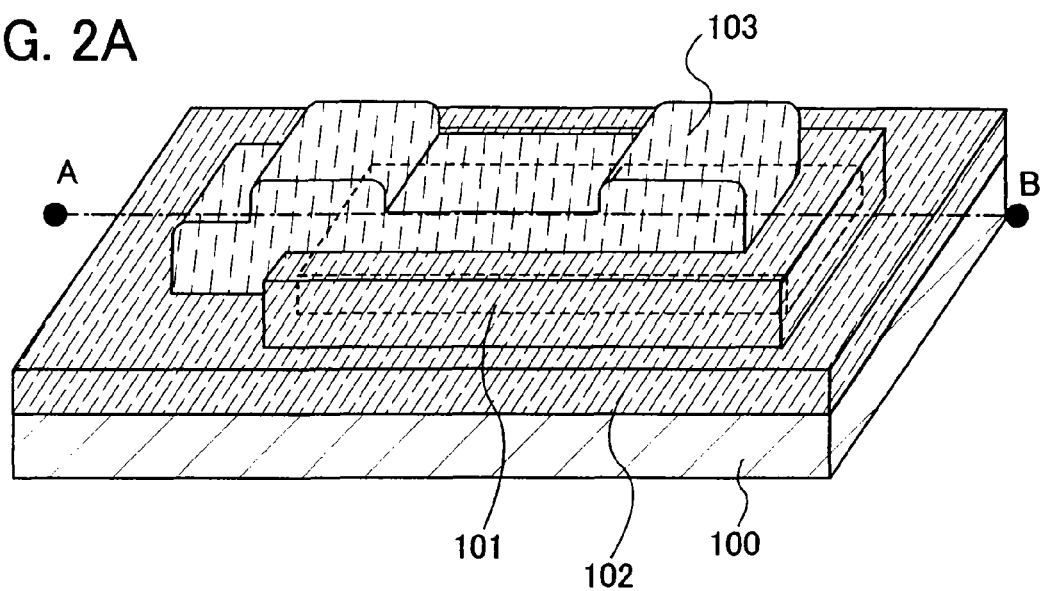
FIGS. 2A and 2B illustrate a manufacturing process of a microstructure of the invention.

Next, as shown in FIG. 2A, a structural layer 102 is formed over the sacrificial layer 101 by sputtering, CVD, or the like. The structural layer 102 can be formed from a silicon layer. As a material of the silicon layer, there is silicon germanium in which silicon contains germanium by about 0.01 to 4.5 atomic %. The silicon layer may be either in an amorphous state or a crystalline state. The structural layer 102 can also be formed by using silicon oxide or silicon nitride, or using a metal material such as titanium (Ti), aluminum (Al), molybdenum (Mo), or tungsten (W). Alternatively, the structural layer 102 can be formed by using a metal compound which is a compound of the aforementioned metal and silicon. In addition, the structural layer 102 may be formed to have either a single-layer structure or a stacked structure. In the case of a stacked structure, a material selected from the aforementioned materials may be stacked.

In the case where the structural layer 102 formed from a silicon layer is required to have conductivity, it may be doped with impurity elements such as phosphorus, arsenic, or boron. By doping the structural layer 102 with such impurity elements, an impurity region may be formed. The impurity region can be formed by forming a resist mask using photolithography and selectively adding impurity elements into the structural layer 102. As a method of adding impurity elements, ion doping or ion implantation can be used. Such a microstructure having conductivity is preferably controlled with an electrostatic force (also referred to as electrostatic attraction), which is thus suitable for a cantilever switch. It is needless to mention that the microstructure may be controlled with an electromagnetic force.

After forming an impurity region, thermal treatment may be applied in order to activate the impurity elements.

The materials of the sacrificial layer 101 and the structural layer 102 are not limited to the aforementioned ones, and it is only required to use a combination of materials which allows the sacrificial layer 101 to be selectively removed. Therefore, the sacrificial layer 101 and the structural layer 102 may be formed by using either the same materials or a combination of a material which can be selectively etched with a specific etchant and a material which cannot be selectively etched with the same etchant, in accordance with a crystalline state or the like.

In this manner, by forming a structural layer using a thin film made of a silicon layer or the like, quite a thin layer can be obtained, compared with the case of using a wafer. In addition, since such a structural layer can be formed over an insulating substrate, production cost can be reduced.

Figure 2B:
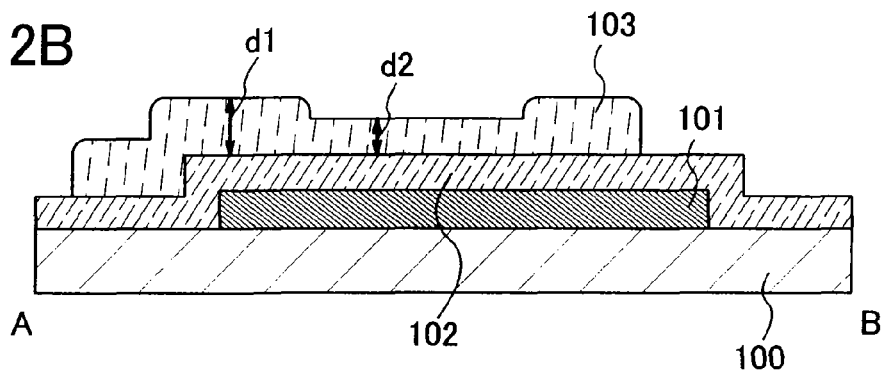

Next, a mask 103 is formed over the structural layer 102 as shown in FIG. 2A. Note that FIG. 2B shows a cross section along a line A-B in FIG. 2A.

The mask 103 may be formed by using a commercial resist material containing a photosensitizing agent, and either a positive resist or a negative resist can be used. As a typical positive resist, there are a novolac resin and a naphthoquinone diazide compound which is a photosensitizing agent. As a typical negative resist, there are a base resin, diphenylsilanediol, an acid generating agent, and the like. Further, a resin material such as an epoxy resin, an acrylic resin, a phenol resin, a melamine resin, or a urethane resin can be used. Alternatively, the mask 103 can be formed by a droplet discharge method using an organic material such as benzocyclobutene, parylene, fluorinated arylene ether, or light-transmissive polyimide, a compound material formed by polymerization of siloxane-based polymers and the like, a composite material containing water-soluble homopolymers and water-soluble copolymers, or the like.

Then, the mask 103 is exposed to light and developed so as to form a predetermined shape. In this embodiment mode, the mask 103 is formed to have a shape which can cover a large area of the sacrificial layer 101. Further, as shown in FIG. 2B, the mask 103 is formed to have a nonuniform thickness. In this embodiment mode, the mask 103 has a first thickness (d1) and a second thickness (d2), and the second thickness is thinner than the first thickness (d2<d1).

In order to form the mask 103, a light-exposure mask having an auxiliary pattern which is formed of a diffraction grating pattern or a semi-transmissive film having a function of reducing the light intensity is used. As a light-exposure mask, a photomask or a reticle can be given as an example. Such a light-exposure mask will be described with reference to FIGS. 6A to 8B. Note that in FIGS. 6A to 8B, a width of a light-shielding portion for forming a mask region with a first thickness (d1) is denoted by t1 and t3, while a width of a portion which is provided with an auxiliary pattern for forming a mask with a second thickness (d2) is denoted by t2.

Figure 6A:
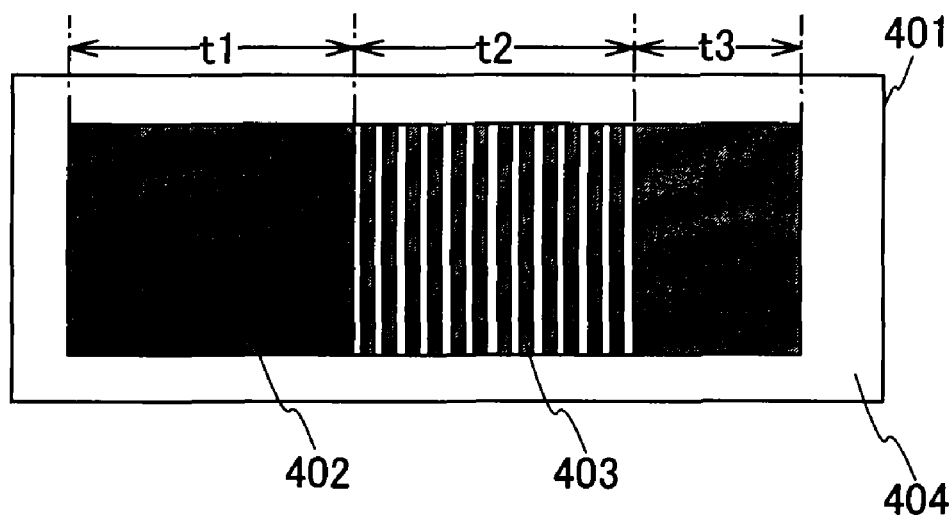
FIGS. 6A and 6B illustrate masks of the invention.

FIG. 6A shows a partial top view of a light-exposure mask 401, which has a diffraction grating pattern portion 403 having slits with line-and-space features with a size equal to or smaller than the resolution limit of an light-exposure apparatus, a light-shielding portion 402, and a light-transmissive portion 404. The diffraction grating pattern portion 403 is a pattern where at least one pattern such as a slit or a dot is provided. In the case of providing a plurality of patterns such as slits and dots, they may be provided either periodically or not periodically. By using a fine pattern with a size equal to or smaller than the resolution limit, the substantial quantity of light to which a mask is exposed can be controlled, thereby the thickness of a mask obtained after the light exposure can be controlled.

Figure 7:
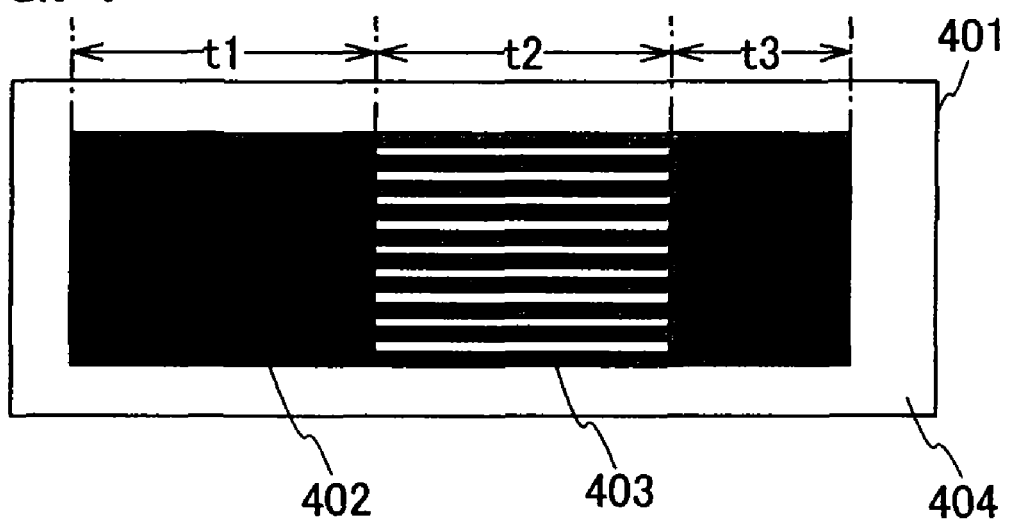
FIG. 7 illustrates a mask of the invention.

The direction of the slits of the diffraction grating pattern 403 may be either parallel with or perpendicular to a longitudinal direction of the light-shielding portion 402 as shown in FIG. 7. Note that in the case where a resist is used as a mask for this photolithography process, it is difficult to use a negative resist; therefore, description is made herein on the premise of using a positive resist.

Figure 6B:
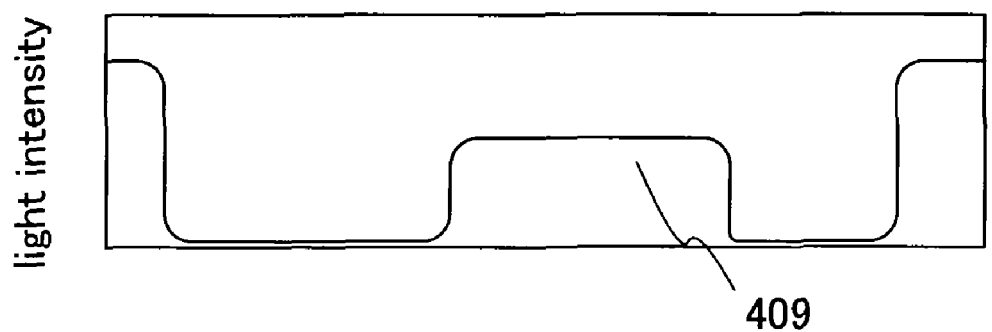

When the light-exposure mask 401 is irradiated with light, the intensity of light which travels through the light-shielding portion 402 is zero, while the intensity of light which travels through the light-transmissive portion 404 is 100%. On the other hand, the intensity of light which travels through the diffraction grating pattern portion 403 with line-and-space features with a size equal to or smaller than the resolution limit of a light-exposure system, can be controlled to be in the range of 10 to 70%. FIG. 6B shows a light intensity distribution 409 as an example of such light intensity. The intensity of light which travels through the diffraction grating pattern portion 403 is controlled by adjusting the pitch and width of the slits.

Figure 8A:
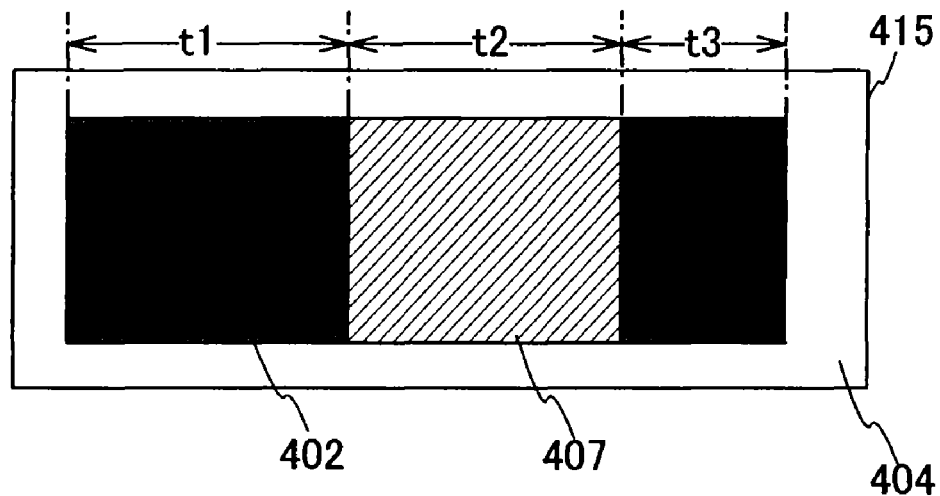
FIGS. 8A and 8B illustrate masks of the invention.

As a specific example of the auxiliary pattern, FIG. 8A shows a partial top view of a light-exposure mask 415, which has a semi-transmissive portion 407 formed of a semi-transmissive film having a function of reducing the light intensity of the exposure light, and also has the light-shielding portion 402 and the light-transmissive portion 404 similarly to FIGS. 6A and 7. As the semi-transmissive film, silicide such as MoSiN, MoSi, MoSiO, MoSiON, or CrSi can be used. The light-exposure method using a light-exposure mask having the semi-transmissive portion 407 is also called a half-tone light-exposure method.

Figure 8B:
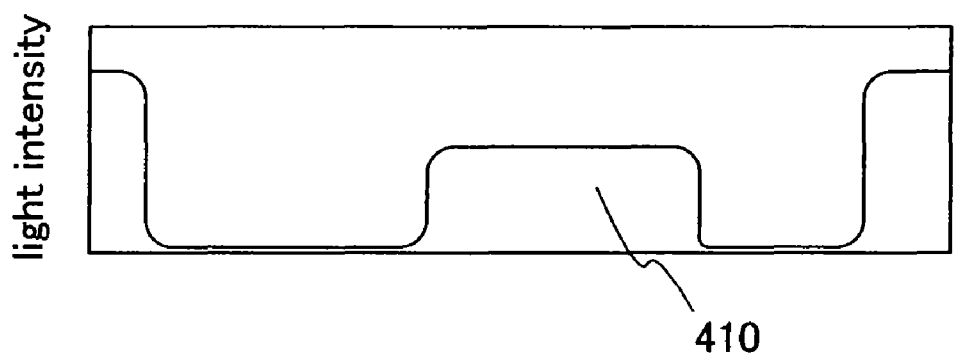

When such a light-exposure mask 415 is irradiated with light, the intensity of light which travels through the light-shielding portion 402 is zero, the intensity of light which travels through the light-transmissive portion 404 is 100%, and the intensity of light which travels through the semi-transmissive portion 407 formed of a semi-transmissive film can be controlled to be in the range of 10 to 70%. That is, the intensity of light which travels through across the semi-transmissive film and the light-shielding portion can be changed continuously or by multiple stages. FIG. 8B shows a light intensity distribution 410 as an example of the intensity of light which travels through the light-exposure mask 415.

When light exposure is performed by using the light-exposure mask 401 or 415, the mask 103 having a first thickness (d1) and a second thickness (d2) can be obtained, where the second thickness is thinner than the first thickness.

The structural layer 102 is etched by using such a mask 103. In this embodiment mode, the structural layer 102 is processed into a rectangular shape such that only one side of the structural layer 102 lies beyond an edge face of the sacrificial layer 101, while the other side thereof lies not beyond the other edge face of the sacrificial layer 101, and additionally, the width of the structural layer 102 is narrower than that of the sacrificial layer 101 when seen from the above. That is, referring to the cross section shown in FIG. 2B, the structural layer 102 and the mask 103 have steps due to the sacrificial layer 101.

Figure 3:
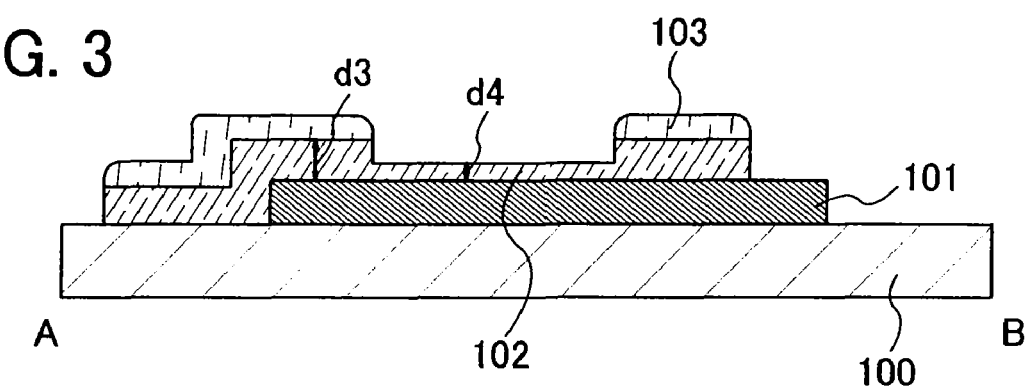
FIG. 3 illustrates a manufacturing process of a microstructure of the invention.

Then, the structural layer 102 is processed by using the mask 103 as shown in FIG. 3. Either wet etching or dry etching can be used for the process. At this time, surfaces of the mask 103 and a portion of the structural layer 102 which is not covered with the mask 103 are gradually removed. Since the mask 103 has a region with the second thickness (d2) which is thinner than the first thickness (d1), the region with the second thickness (d2) is removed first, thereby the structural layer 102 below the mask 103 with the second thickness is removed. As a result, the structural layer 102 can be processed to have a third thickness (d3) and a fourth thickness (d4) by only one etching process, without removing the mask 103 or forming the layer again. In other words, a portion of the structural layer 102 which has the third thickness is formed below the mask 103 with the first thickness, while a portion of the structural layer 102 which has the fourth thickness is formed below the mask 103 with the second thickness. In this embodiment mode, the fourth thickness is thinner than the third thickness in the structural layer 102 (d4<d3).

In addition, in the case of using the microstructure of the invention as a switching element, a movable portion of the structural layer 102 is preferably formed to be 30 to 50 times as long as the thickness of the structural layer 102 having the fourth thickness. At this time, the spring constant of the microstructure is preferably taken into consideration. In addition, the thickness of the structural layer 102 having the third thickness is determined in consideration of the density thereof. In the case where the structural layer having the third thickness has low density, a contact with a bottom electrode can be increased by increasing the thickness of that portion.

Figure 4:
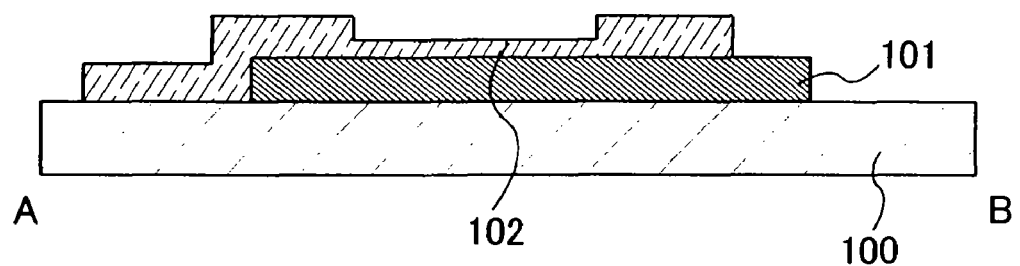
FIG. 4 illustrates a manufacturing process of a microstructure of the invention.

Next, as shown in FIG. 4, the mask 103 is removed. The mask 103 can be removed by either wet etching or dry etching. For example, a stripper such as "Nagase resist strip N-300" (product of Nagase ChemteX Co., Ltd.) which contains 2-amino ethanol and glycol ether as its main components, or "Stripper 710" (product of Tokyo Ohka Kogyo Co., Ltd.) which contains o-dichlorobenzene, phenol, and alkyl benzene sulfonate as its main components can be used.

Figure 5:
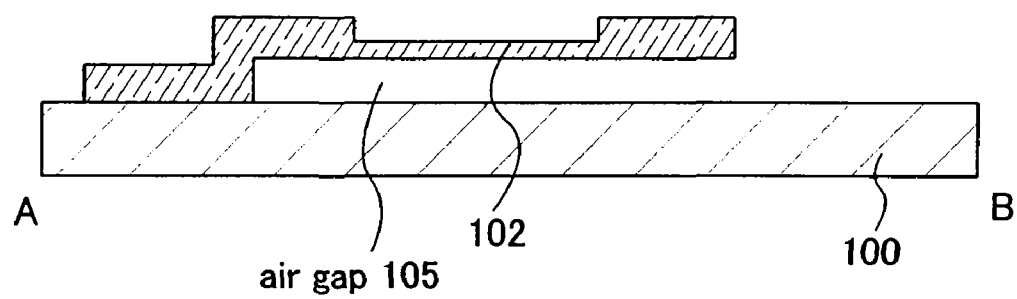
FIG. 5 illustrates a manufacturing process of a microstructure of the invention.

Next, the sacrificial layer 101 is removed as shown in FIG. 5. The sacrificial layer can be removed by either wet etching or dry etching.

For example, in the case where tungsten (W) is used for the sacrificial layer 101, the sacrificial layer 101 can be removed by being soaked in a solution in which 28% of ammonia and 31% of oxygenated water are mixed at a ratio of 1:2, for about 20 minutes. In the case where silicon dioxide ($SiO_2$) is used for the sacrificial layer 101, the sacrificial layer 101 can be removed by using a buffered fluorinated acid in which 49% of a fluorinated acid solution and ammonium fluoride are mixed at a ratio of 1 to 7. In the case where a layer containing silicon is used for the sacrificial layer 101, the sacrificial layer 101 can be removed by using hydroxide of alkaline metal elements such as phosphoric acid, KOH, NaOH, or CsOH. Further, depending on the material used for the sacrificial layer, the sacrificial layer can be removed by using $NH_4OH$, hydrazine, EPD (a mixture of ethylenediamine, pyrocatechol, and water), TMAH, IPA, a NMD3 solution, or the like. As a further alternative, the layer containing silicon can be removed by using halogen fluoride such as chlorine trifluoride ($ClF_3$), nitrogen trifluoride ($NF_3$), bromine trifluoride ($BrF_3$), or hydrogen fluoride (HF).

In a drying process after the wet etching, an organic solvent with low viscosity (e.g., cyclohexane) is preferably used for rinsing, in order to prevent the microstructure from buckling due to a capillary phenomenon. Alternatively, a drying process may be performed under the conditions of a low temperature and low pressure, or both of them can be performed in combination.

As a further alternative, the sacrificial layer 101 can be removed by dry etching using $O_2$, $F_2$, and $XeF_2$ under a high-pressure condition such as the atmospheric pressure. In order to prevent the microstructure from the aforementioned buckling due to a capillary phenomenon, it is preferable to perform plasma treatment so that the surface of the microstructure can have a water-repellent property.

When the sacrificial layer 101 is removed in this manner, an air gap 105 is produced. By utilizing the air gap 105, the structural layer 102 can move up and down or from side to side. Thus, the microstructure can operate as a switch by a contact of a movable edge of the structural layer 102 with a bottom electrode. A microstructure having such a shape is called a cantilever microstructure. When a cantilever microstructure is used as a switch, operation with few losses and low power can be performed.

It is also possible to remove the mask 103 and the sacrificial layer 101 by the same process. In this case, the mask 103 and the sacrificial layer 101 are preferably formed of the same material or materials which can be removed with the same etchant.

In this manner, in the invention, a cantilever microstructure can be manufactured over an insulating substrate by using a thin film typified by a silicon layer. The cantilever microstructure of the invention can be used as a switch, and such a switch can be formed to be thinner and manufactured at lower cost, compared with a switch formed from a silicon wafer.

A cantilever microstructure of the invention can be formed over the same insulating substrate as a semiconductor element, as will be described in the following embodiment modes. As a result, a connection defect between a cantilever microstructure and a semiconductor element can be reduced to increase the mass productivity.

A cantilever microstructure shown in this embodiment mode can be used as a probe of an AFM, an acceleration sensor (G sensor), or an angular velocity sensor in addition to a switch.

EMBODIMENT MODE 2

As a silicon layer used for a structural layer or a sacrificial layer of the invention, a crystalline silicon layer, an amorphous silicon layer, or the like can be used. In this embodiment mode, description will be made of a case of using a crystalline silicon layer as a sacrificial layer.

Figure 13A:
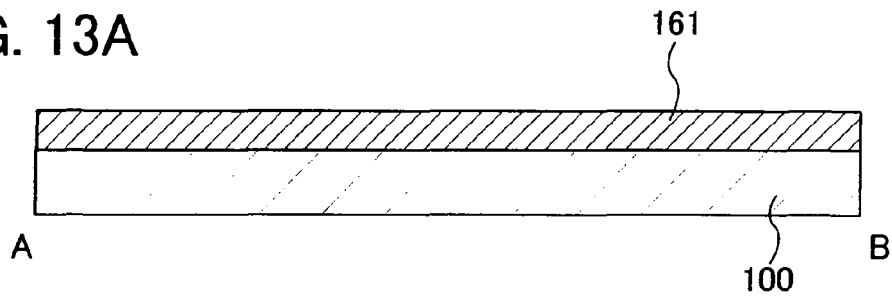
FIGS. 13A to 13E illustrate a manufacturing process of a microstructure of the invention.

First, as shown in FIG. 13A, an amorphous silicon layer 161 is formed over an insulating substrate 100 which is a surface to be formed with a sacrificial layer. The amorphous silicon layer 161 can be manufactured by CVD using a material gas such as $SH_4$ and Ar. The thickness of the amorphous silicon layer 161 corresponds to the thickness of the sacrificial layer as well as the height of an air gap that is produced later.

Then, the amorphous silicon layer is crystallized by thermal treatment, thereby obtaining a crystalline silicon layer. Thermal treatment may be performed by laser irradiation, heating with a heating furnace, irradiation with light emitted from a lamp source (hereinafter referred to as lamp annealing), or a combination of these.

In the case of using laser irradiation, a continuous wave laser beam (hereinafter referred to as a CW laser beam) or a pulsed laser beam may be used. As a laser beam, a laser beam emitted from one or more of the following can be used: an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser. When a fundamental wave of such laser beams or the second to fourth harmonics of the fundamental wave are used, crystals with a large grain size can be obtained. For example, the second harmonic (532 nm) or the third harmonic (355 nm) of an Nd:$YVO_4$ laser (fundamental wave of 1064 nm) can be used. In this case, energy density of a laser beam as high as about 0.01 to 100 $MW/cm^2$ (preferably, 0.1 to 10 $MW/cm^2$) is required. The scanning rate is set to be about 10 to 2000 cm/sec to irradiate the semiconductor film.

Note that a fundamental wave of a CW laser beam and a high harmonic of a CW laser beam may be used for irradiation, or a fundamental wave of a CW laser beam and a high harmonic of a pulsed laser beam may be used for irradiation. By using a plurality of laser beams for irradiation in this manner, the energy can be compensated.

It is also possible to use a pulsed laser beam which oscillates at a repetition rate that allows a laser beam of a next pulse to be delivered before a silicon layer is melted and solidified by a previous laser beam. By oscillating a laser beam at such a repetition rate, crystal grains which have grown continuously in the scan direction can be obtained. As a specific repetition rate of a laser beam, a repetition rate of not lower than 10 MHz, and much higher than the normally used frequency band, which is in the range of several ten to several hundred Hz, is used.

In the case of using a heating furnace as alternative thermal treatment, the amorphous silicon layer is heated at 400 to 550° C. for 2 to 20 hours. At this time, it is preferable to set temperatures at multiple stages in the range of 400 to 550° C. so that the temperature becomes gradually higher. By a low-temperature thermal process at about 400° C. at the initial stage, hydrogen or the like comes out of the amorphous silicon layer. Therefore, a surface roughness of the film due to crystallization can be reduced.

Further, when crystallization is performed using a metal which promotes crystallization, the heating temperature can be lowered. For example, when heating is performed after forming nickel (Ni) over the amorphous silicon layer, the heating temperature is lowered. As such a metal, there are iron (Fe), ruthenium (Ru), rhodium (Rh), palladium (Pd), osmium (Os), iridium (Ir), platinum (Pt), copper (Cu), gold (Au), and the like.

In addition to the thermal treatment, the aforementioned laser irradiation may be performed to form a crystalline silicon layer.

Figure 13B:
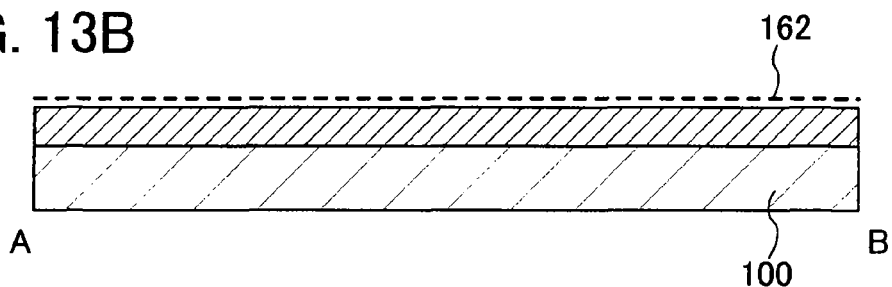

In this embodiment mode, a solution containing nickel is applied to the amorphous silicon layer 161 as shown in FIG. 13B, and then crystallization is performed thereto by using a heating furnace. The heating temperature is set at 500 to 550° C.

Figure 13C:
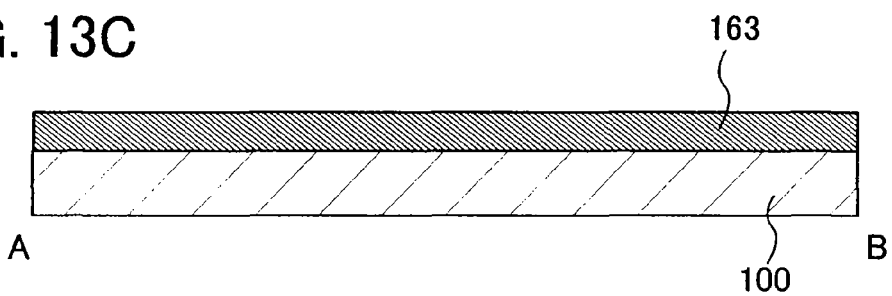

Then, as shown in FIG. 13C, a silicon layer (polycrystalline silicon layer) 163 formed by crystallization with a metal can be obtained.

Figure 13D:
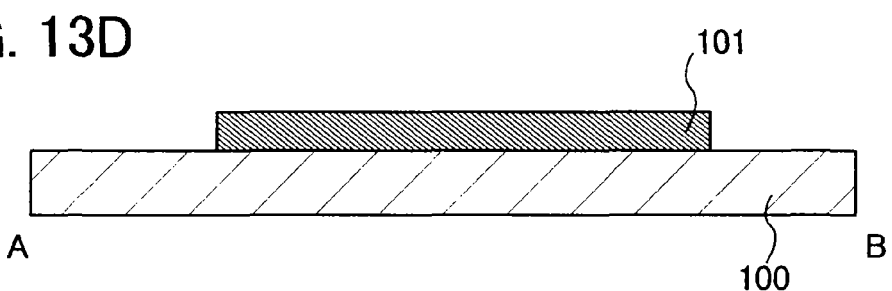

After that, the polycrystalline silicon layer 163 is processed as shown in FIG. 13D, thereby the sacrificial layer 101 having a predetermined shape can be formed. The polycrystalline silicon layer can be processed by forming a mask using photolithography and then etching the polycrystalline silicon layer using the mask.

Figure 13E:
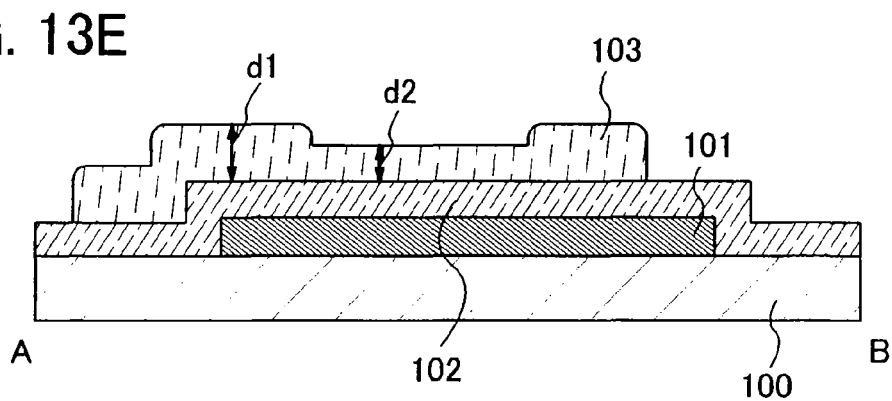

Then, as shown in FIG. 13E, a cantilever microstructure can be manufactured similarly to Embodiment Mode 1.

Although the description has been made of the case where polycrystalline silicon obtained by crystallization with a metal is used as the sacrificial layer 101, the polycrystalline silicon layer may be used as the structural layer 102 as well. Such polycrystalline silicon obtained by crystallization with a metal can have continuous crystal grain boundaries. Unlike the polycrystalline silicon which is obtained by crystallization without a metal, the polycrystalline silicon which has continuous crystal grain boundaries will have no covalent bond cleavage at crystal grain boundaries. Therefore, stress concentration which results from defects at crystal grain boundaries does not occur, and accordingly, a breaking stress is made higher than that of the polycrystalline silicon obtained by crystallization without a metal. Such polycrystalline silicon has a similar crystalline structure to single crystalline silicon, and thus polycrystalline silicon having higher toughness than the polycrystalline silicon manufactured by crystallization without a metal can be obtained. Such polycrystalline silicon is suitable for the movable structural layer 102.

Since a polycrystalline silicon layer having continuous grain boundaries has high electron mobility, it is suitable for the case of controlling the structural layer 102 with an electrostatic force. Further, when the metal for promoting crystallization is kept remained in the polycrystalline silicon layer, the structural layer 102 can have conductivity. Such a polycrystalline silicon layer having conductivity is suitable for a microelectromechanical system which controls the structural layer 102 with an electrostatic force. It is needless to mention that a polycrystalline silicon layer obtained by crystallization with a metal may be used as the structural layer 102 in the case where the microstructure is controlled with an electromagnetic force.

In the case of using nickel for the metal, nickel silicide is formed in the silicon layer depending on the concentration of the nickel. In general, a silicon alloy such as nickel silicide is known for its high strength. Therefore, silicide can be formed by using a metal for crystallization, and thus the structural layer 102 which is harder and has higher conductivity can be manufactured.

Such silicide can be formed by using not only nickel but also tungsten, titanium, molybdenum, tantalum, cobalt, or platinum. In the case of using such metals, a tungsten silicide layer, a titanium silicide layer, a molybdenum silicide layer, a tantalum silicide layer, a cobalt silicide layer, or a platinum silicide layer is formed. Among such metals, cobalt and platinum can be used as the metals for lowering the heating temperature of crystallization.

The structural layer 102 may have a stacked layer, and can be formed by stacking a layer containing nickel silicide (a nickel silicide layer) and a polycrystalline silicon layer. By employing such a stacked structure, the structural layer 102 which is flexible and has high conductivity can be obtained. In addition, when stacking an amorphous silicon layer and a nickel silicide layer as the structural layer 102, the structural layer 102 which is hard and has high conductivity can be obtained.

As described above, in the case of performing crystallization with a metal, crystallization can be performed at a lower temperature as compared with the crystallization without a metal. Therefore, the selection range of materials which can be used for a substrate to be formed with a microstructure can be widened. For example, in the case of crystallizing a silicon layer only by heating, heating is required to be performed at a temperature of about 1000° C. for about 1 hour, and therefore, a glass substrate which has low resistance to heat cannot be used. However, when crystallization is performed by using a metal as in this embodiment mode, a glass substrate or the like which has low strain point can be used.

This embodiment mode can be implemented in combination with the aforementioned embodiment mode as appropriate.

EMBODIMENT MODE 3

In the case where a microstructure of the invention is moved with an electrostatic force, a bottom electrode to be used as a common electrode or a control electrode is formed below a structural layer. Thus, this embodiment mode describes a cantilever microstructure having a bottom electrode.

Figure 12:
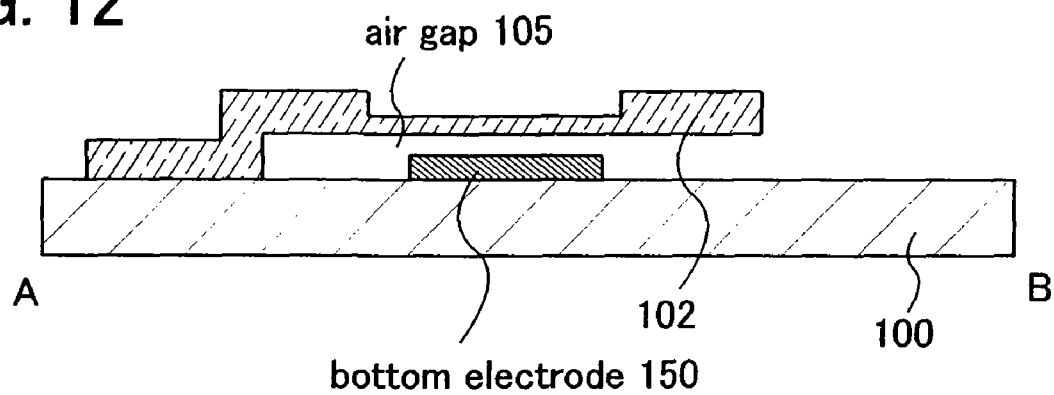
FIG. 12 illustrates a microstructure of the invention.

As shown in FIG. 12, a conductive layer functioning as a bottom electrode 150 is formed in the air gap 105 below the structural layer 102. The bottom electrode 150 can be used as a common electrode, a control electrode, or the like. The bottom electrode 150 can be formed by sputtering or the like by using a metal such as tungsten or a conductive substance, and etched into a predetermined shape as required.

This embodiment mode can be implemented in combination with the aforementioned embodiment modes as appropriate.

EMBODIMENT MODE 4

This embodiment mode describes the kinds of a cantilever to which the microstructure of the invention can be applied.

Figure 15A:
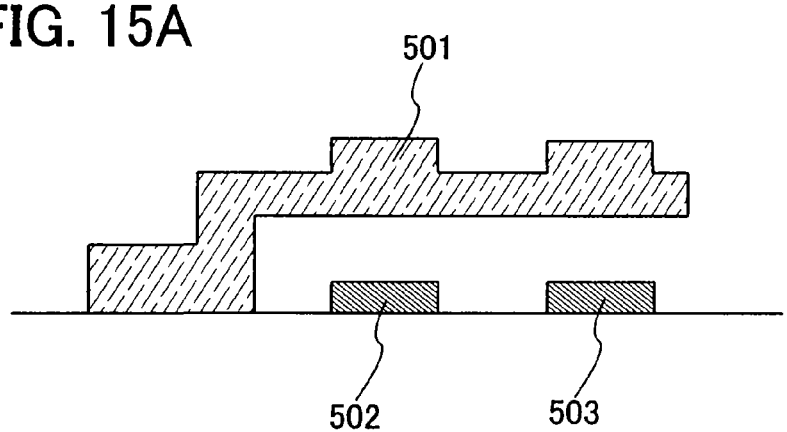
FIGS. 15A to 15C illustrate a microstructure of the invention.

As shown in FIG. 15A, a first electrode 502 and a second electrode 503 are provided below a structural layer 501. The first electrode 502 functions as a control electrode, while the second electrode 503 functions as a contact electrode. The first electrode 502 functioning as a control electrode is input with a selection signal for determining whether to select the structural layer 501 or not. When a selection signal is input, a potential difference is generated between the structural layer 501 and the first electrode 502, and the resulting static electricity causes the structural layer 501 to move downward. Then, an edge of the structural layer 501 makes a contact with the second electrode 503 functioning as a contact electrode, and thus a current flows thereto.

Figure 15B:
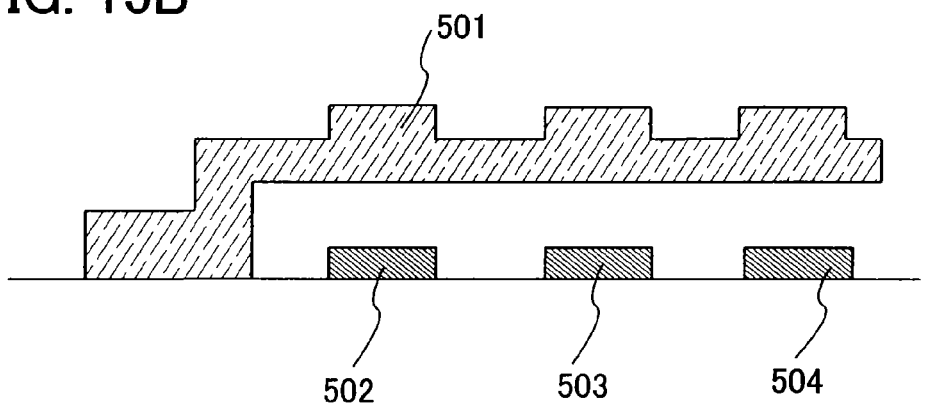

The number of the electrodes functioning as control electrodes and the electrodes functioning as contact electrodes may be more than one. For example, two first electrodes 502 and 504 functioning as the control electrodes may be provided as shown in FIG. 15B. With the static electricity generated between the control electrodes 502 and 504 and the structural layer 501, the structural layer 501 can move up and down. Accordingly, by providing a plurality of control electrodes, the operation of the structural layer 501 can be controlled accurately even when the structural layer 501 is large and difficult to be operated. In addition, the operation can also be controlled accurately by increasing the area of the control electrodes. Similarly, the number and the area of the contact electrodes may be increased. Accordingly, contact resistance can be lowered to obtain an accurate contact.

A microstructure located above the control and contact electrodes is provided to be thicker than the microstructure in other regions. As a result, the weight of the structural layer 501 is increased so that the descending operation of the structural layer 501 can be easily controlled, in particular. Accordingly, an accurate contact can be obtained.

By selecting the structural layer 501 in this manner, the microstructure can operate as a cantilever switch.

Figure 15C:
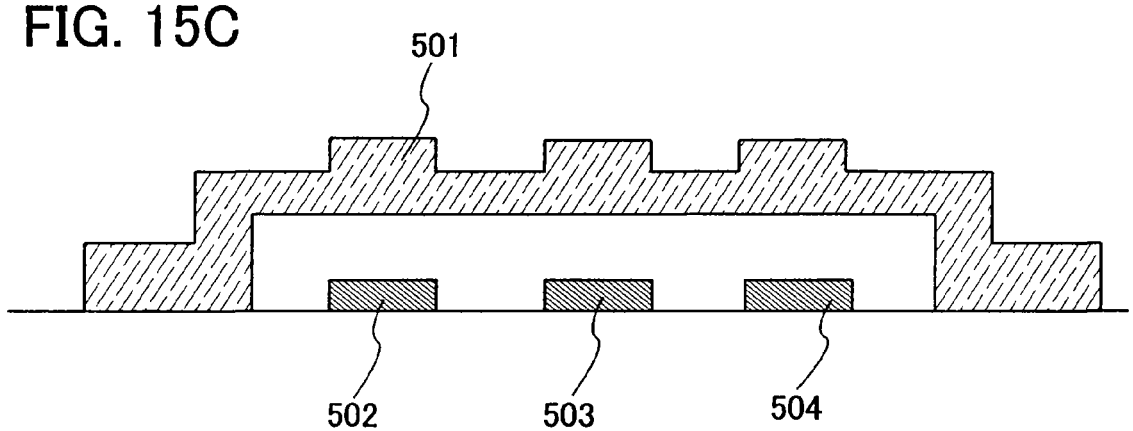

FIG. 15C shows a bridge-type switch which is different from a cantilever switch. In the bridge-type switch, both ends of the structural layer 501 are secured, and the other structures are similar to those in FIG. 15B. Such a bridge-type structural layer 501 can be formed by using a mask having a nonuniform thickness in accordance with the invention.

In the aforementioned switch of the invention, the structural layer 501 which makes a contact with the electrodes may be provided with a highly conductive film in order to lower the contact resistance. In addition, each electrode may also be provided with a highly conductive film. Such a film can reduce not only the contact resistance but also the abrasion between the microstructure and the electrodes.

Figure 16A:
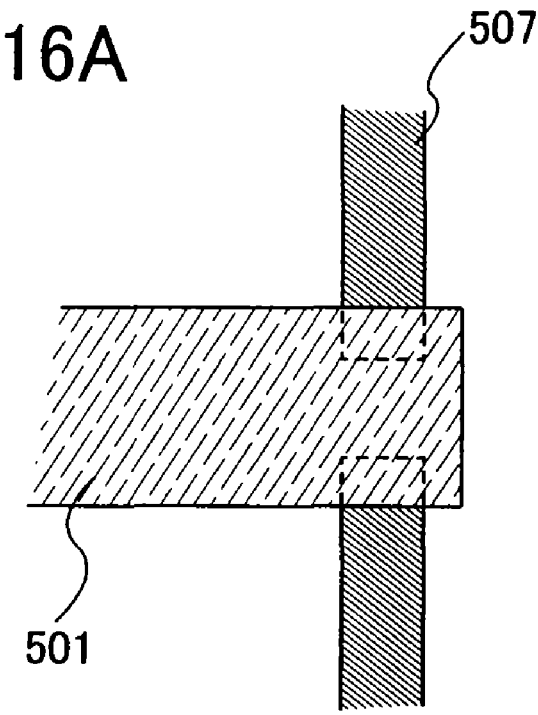
FIGS. 16A and 16B illustrate a microstructure of the invention.

FIG. 16A shows a top view of a switch having a microstructure. A wire 507 which is cut is provided below the structural layer 501, and the structural layer 501 and the wire 507 are provided to overlap with each other. The structural layer 501 may have either a cantilever shape or a bridge shape.

When the switch shown in FIG. 16A is selected, the wire 507 becomes electrically conductive so that it can flow current or signals. Thus, it can function as a switch. Such a switch is called a series switch.

Figure 16B:
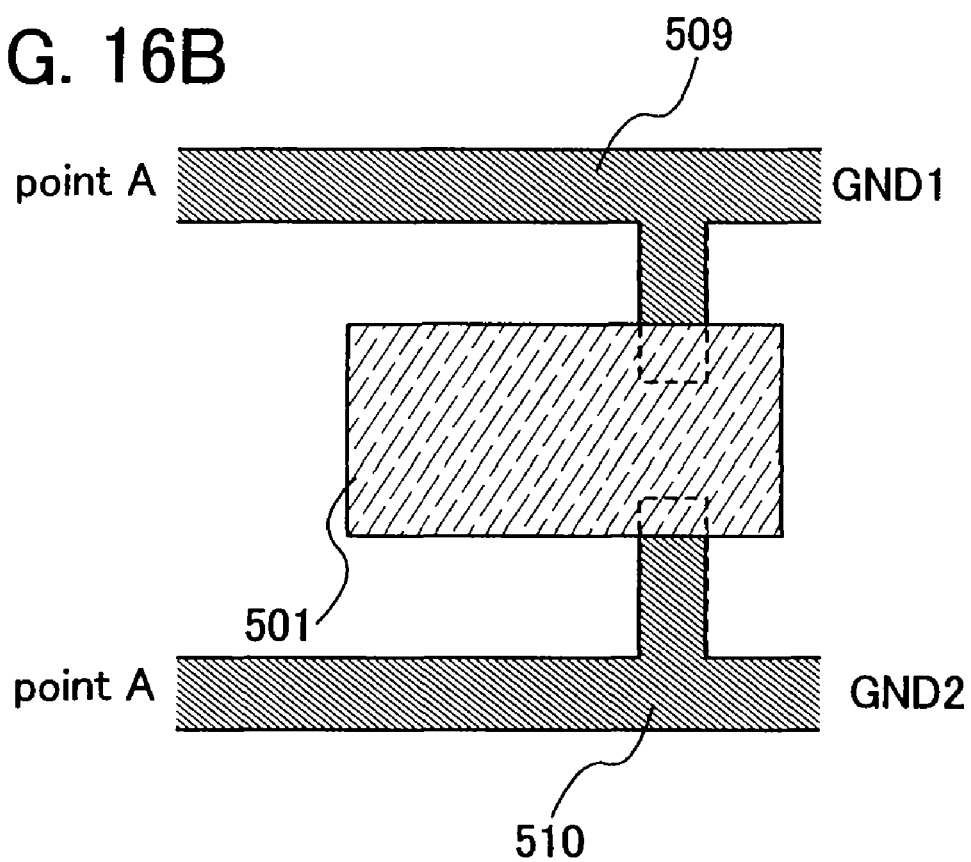

FIG. 16B shows a top view of a switch which is different from the switch shown in FIG. 16A. Wires 509 and 510 are provided in parallel, and each wire is provided with a T-shaped connecting region. In the connecting regions, a structural layer 501 is provided above the wires 509 and 510. When the structural layer 501 is in an off state, a current flows from a point A that is one end of the wire 509 to GND1 that is the other end. Similarly, when the structural layer 501 is in an off state, a current flows from a point B that is one end of the wire 510 to a GND2 that is the other end. In such a mode, when the structural layer 501 is selected to be turned on, a signal flows from the point A to the point B. Such a switch is called a shunt switch.

Although the description has been made of a mode where a current flows to a cantilever switch, that is a mode where a signal is transmitted thereto when the cantilever switch is turned on, the invention may be applied to a mode where a signal is not transmitted to a cantilever switch when it is turned on.

EMBODIMENT MODE 5

Since a microstructure performs an up-and-down moving operation or a side-to-side moving operation as well as a rotating operation, it is easily affected by air resistance. Thus, this embodiment mode describes a mode of a microstructure with reduced air resistance.

Figure 18A:
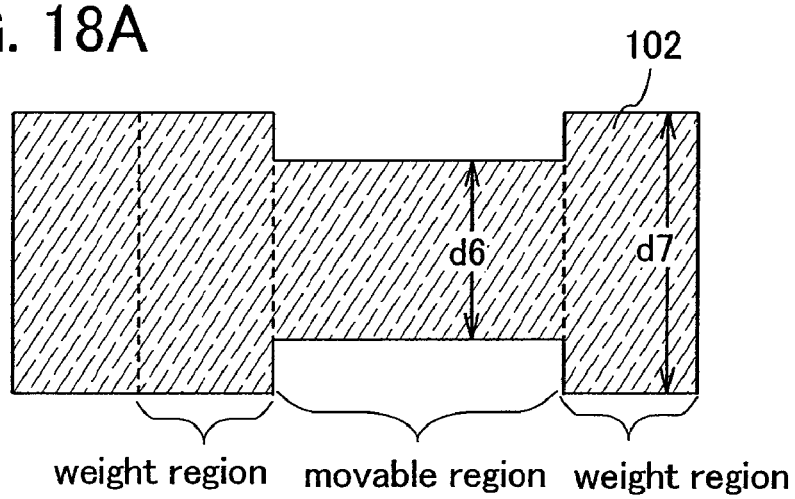
FIGS. 18A to 18C illustrate microstructures of the invention.

FIG. 18A shows a top view of the structural layer 501. In the structural layer 501, a width (d6) of a movable region is formed to be narrower than a width (d7) of a region provided with a weight (hereinafter called a weight region) (d6<d7). By forming the movable region to have a narrower width than the weight region, the operation of the movable portion can be performed smoothly.

At this time, degradation of the movable portion due to the up-and-down moving operation is considered. For example, degradation of the movable portion due to its operation can be prevented by controlling the thickness of the microstructure in the movable region.

Figure 18B:
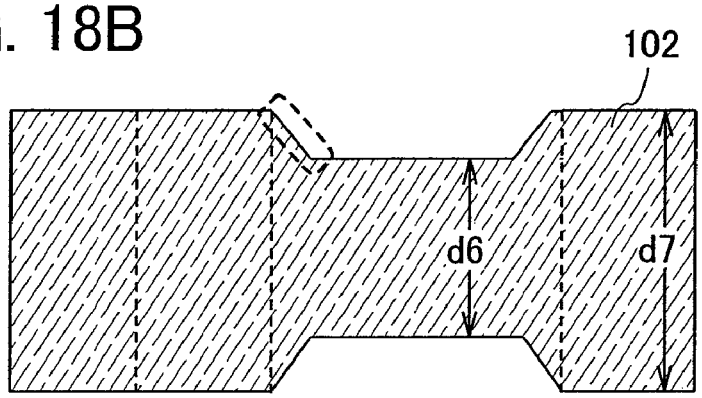

FIG. 18B shows a top view of a microstructure having a tapered boundary between a movable region and a weight region, unlike FIG. 18A. By forming the boundary to be tapered, the operation of the movable portion can be performed smoothly.

Figure 18C:
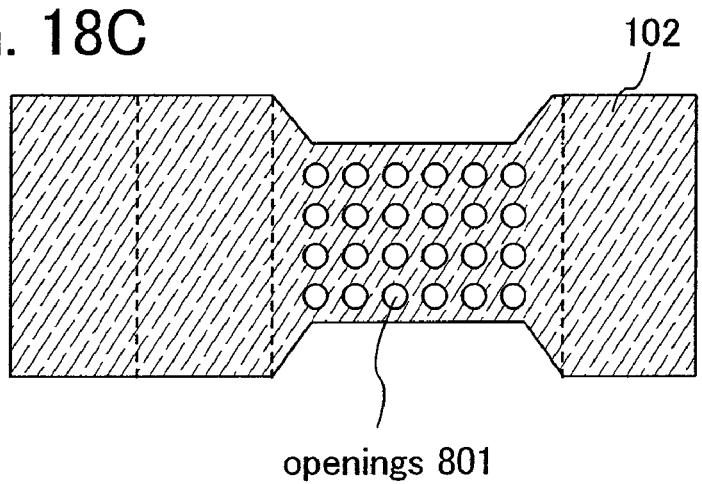

FIG. 18C shows an example where, in addition to the microstructure shown in FIG. 18B, a movable region of the microstructure is provided with openings 801. The number of the openings 801 may be either one or more than one. In the case of providing a single opening, the diameter of the opening is set large, while in the case of providing a plurality of openings, the diameter of each opening is not required to be set very large. With the openings 801, air resistance can be reduced when the microstructure performs the up-and-down moving operation.

Such a microstructure having openings can be formed by using a mask having a nonuniform thickness in accordance with the invention.

The microstructure of such a mode can be combined with the aforementioned embodiment modes as appropriate.

EMBODIMENT MODE 6

A switch having a microstructure may have a number of output terminals. This embodiment mode describes a mode of a switch which has number of output terminals.

Figure 19:
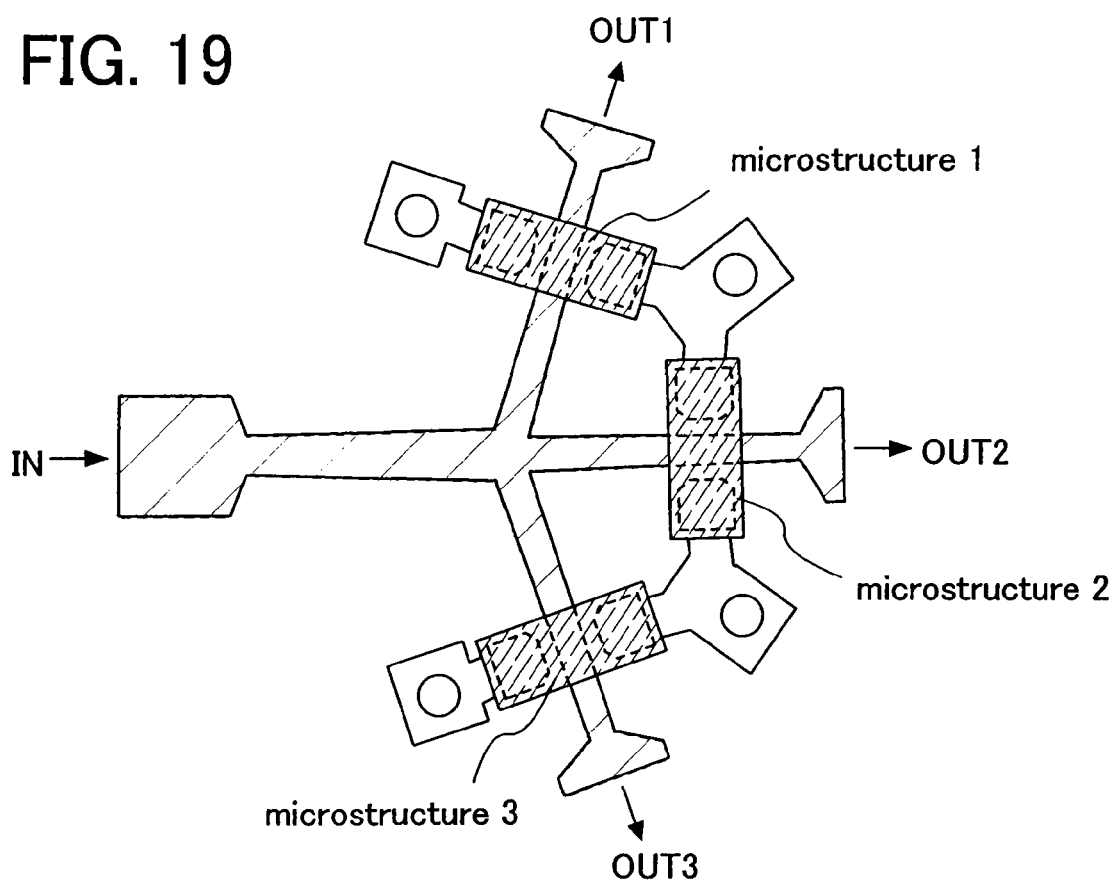
FIG. 19 illustrates a switch to which a microstructure of the invention is applied.

FIG. 19 shows a switch having three output terminals (OUTs1 to 3) with respect to one input terminal (IN). Which of the output terminals a signal is to be output to is determined by microstructures 1 to 3. For example, when the microstructure 1 is selected, a signal is output from the IN to the OUT 1. Meanwhile, when the microstructures 1 and 2 are selected, a signal is output from the IN to each of the OUTs1 and 2. The microstructures 1 to 3 are formed by using a mask with a nonuniform thickness in accordance with the invention.

Although this embodiment mode describes a case of providing three output terminals, the invention is not limited to this. A switch having a microstructure of the invention may have two output terminals or four or more output terminals.

EMBODIMENT MODE 7

This embodiment mode describes a method of forming the aforementioned microstructure and a semiconductor element for controlling the microstructure over the same surface. In this embodiment mode, description is made of a case where a top-gate thin film transistor having a gate electrode above a semiconductor film is used as a semiconductor element.

Figure 10A:
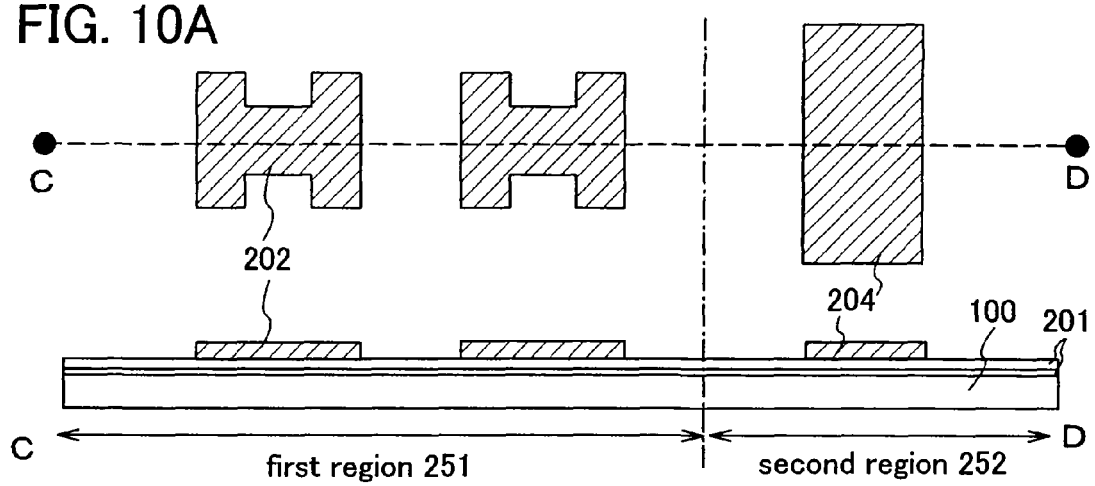
FIGS. 10A to 10C illustrate a manufacturing process of a microstructure of the invention.

As shown in FIG. 10A, a base layer 201 is formed over an insulating substrate 100. The insulating substrate 100 may be similar to the one described in Embodiment Mode 1. The base layer 201 may be an insulating layer containing silicon. As an insulating layer containing silicon, oxide of silicon or nitride of silicon can be given as an example, and typically, there are silicon oxide, silicon nitride, silicon oxynitride, and the like. The base layer 201 may have either a single-layer structure or a stacked structure by using such materials.

This embodiment mode describes a case of forming the base layer 201 to have a two-layer structure. As a first layer of the base layer 201, a silicon oxynitride layer with a thickness of 10 to 200 nm (preferably, 50 to 100 nm) is formed. The silicon oxynitride layer can be formed by plasma CVD, using SiH$_4$, NH$_3$, N$_2$O, and H$_2$ as reactive gases. Subsequently, a silicon oxynitride layer with a thickness of 50 to 200 nm (preferably, 100 to 150 nm) is formed as a second layer of the base layer 201. The silicon oxynitride layer can be formed by plasma CVD, using SiH$_4$ and N$_2$O as reactive gases.

A semiconductor layer is formed over the base layer 201. The semiconductor layer can be formed by using a silicon layer. As a method for manufacturing a polycrystalline silicon layer, the method described in Embodiment Mode 2 can be referred to. In this embodiment mode, a polycrystalline silicon layer is manufactured by forming an amorphous silicon layer and then crystallizing it with a metal.

Such a polycrystalline silicon layer is suitable not only for a microstructure but also for a semiconductor element because of its high mobility.

After that, the polycrystalline silicon layer in a first region 251 for forming a semiconductor element and in a second region 252 for forming a microstructure is processed into silicon layers 202 and 204 each having a predetermined shape. The polycrystalline silicon layer in the first region 251 is processed so as to form an active layer of a semiconductor element. Note that the active layer includes a channel formation region, a source region, and a drain region. In addition, the polycrystalline silicon layer in the second region 252 is processed a rectangular shape as shown in the aforementioned embodiment modes.

Figure 10B:
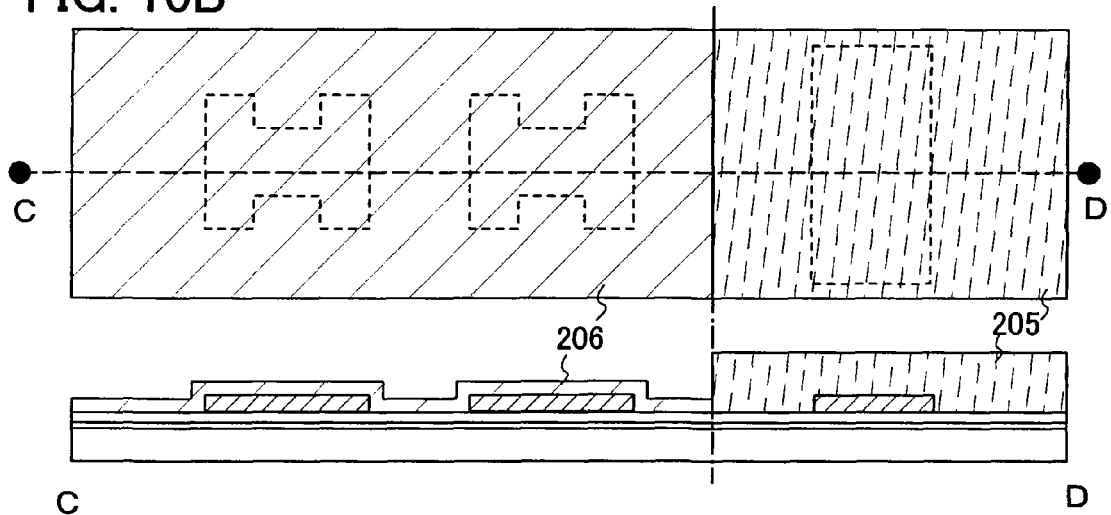

As shown in FIG. 10B, an insulating layer 206 functioning as a gate insulating layer is formed only in the first region 251. The insulating layer 206 can be formed by using oxide of silicon or nitride of silicon. As typical examples, there are silicon oxide, silicon nitride, silicon oxynitride, and the like. In order to selectively form the insulating layer 206 in the first region 251, the second region 252 is covered with a mask 205. The mask 205 may be formed by using a commercial resist material containing a photosensitizing agent, and either a positive resist or a negative resist can be used. As a typical positive resist, there are a novolac resin and a naphthoquinone diazide compound which is a photosensitizing agent. As a typical negative resist, there are a base resin, diphenylsilanediol, an acid generating agent, and the like. Further, a resin material such as an epoxy resin, an acrylic resin, a phenol resin, a melamine resin, or a urethane resin can be used. Alternatively, the mask 205 can be formed by a droplet discharge method by using an organic material such as benzocyclobutene, parylene, fluorinated arylene ether, or light-transmissive polyimide, a compound material formed by polymerization of siloxane-based polymers, a composite material containing water-soluble homopolymers and water-soluble copolymers, or the like. As a further alternative, the insulating layer 206 may be formed across the first region 251 and the second region 252, and the insulating layer 206 in the second region 252 may be removed later.

Although the description has been made of a case of forming the insulating layer 206 only in the first region 251, the insulating layer 206 may be formed in the second region 262 as well, as long as the silicon layer to serve as the sacrificial layer 204 can be removed.

Figure 10C:
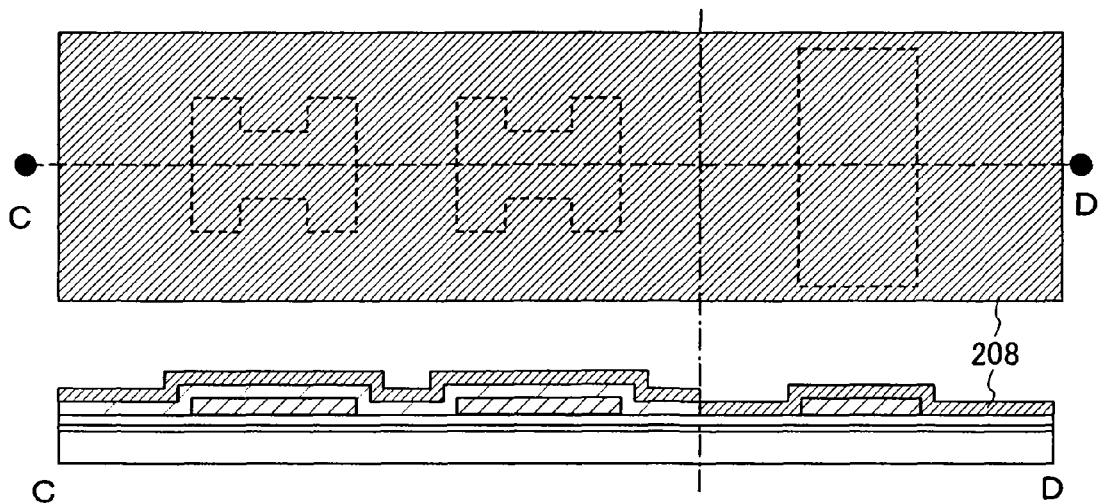

After removing the mask 205 as shown in FIG. 10C, a conductive layer 208 functioning as a gate electrode is formed across the first region 251 and the second region 252. The conductive layer 208 is formed by using a film made of an element such as aluminum (Al), titanium (Ti), molybdenum (Mo), tantalum (Ta), tungsten (W), or silicon, or an alloy film containing such elements. The conductive layer 208 may be formed to have either a single-layer structure or a stacked structure. As a stacked structure, a stacked structure of tantalum nitride and tungsten can be employed. The conductive layer 208 can be manufactured by sputtering or CVD.

Figure 11A:
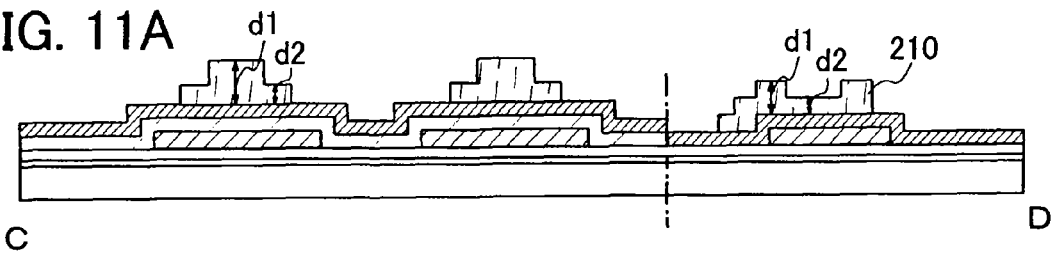
FIGS. 11A to 11F illustrate a manufacturing process of a microstructure of the invention.

As shown in FIG. 11A, a mask 210 is formed over the conductive layer 208 in the first region 251 and the second region 252. The mask 210 can be formed by photolithography. Photolithography is performed by using a photomask or a reticle having an auxiliary pattern which is formed of a diffraction grating pattern or a semi-transmissive film having a function of reducing the light intensity. In a region where an auxiliary pattern which is formed of a diffraction grating pattern or a semi-transmissive film having a function of reducing the light intensity is provided, light transmissivity is reduced. As a result, the mask 210 having a first thickness (d1) and a second thickness (d2) thinner than d1 can be formed. A region of which light transmissivity is reduced corresponds to a second-thickness (d2) region of the mask. Note that the mask 210 in the first region 251 is formed such that d1 is located in the inner side than d2, while the mask 210 in the second region 252 is formed such that d2 is located in the inner side than d1. In this manner, which region of the mask is to be thinner can be determined based on the pattern to be processed. After that, the conductive layer 208 is processed by wet etching or dry etching.

Figure 11B:
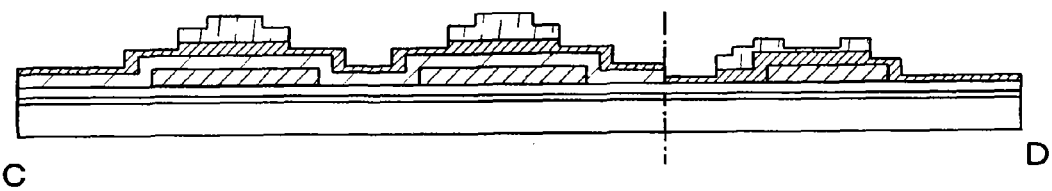
Figure 11C:
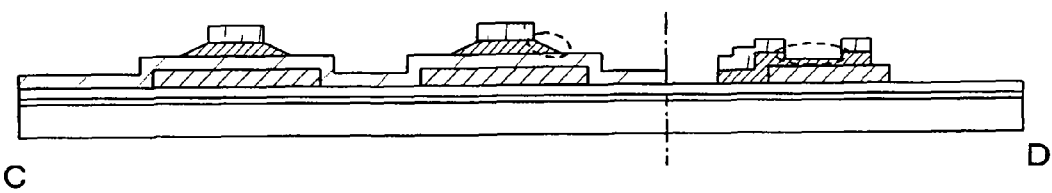

As shown in FIG. 11B, when etching is started, surfaces of the mask 210 and the conductive layer 208 which is not covered with the mask 210 are gradually removed. The mask 210 is etched in such a manner that the second-thickness (d2) region is removed first so that the conductive layer 208 is gradually exposed. As a result, as shown in FIG. 11C, an edge of the conductive layer 208 in the first region 251 is tapered (indicated by the dashed region), while a central portion of the conductive layer 208 in the second region 252 is depressed (indicated by the dashed region). In order to form a tapered edge, it is preferable to expose the mask 210 to light with a photomask or a reticle having an auxiliary pattern which is formed of a diffraction grating pattern or a semi-transmissive film having a function of reducing the light intensity, so that the light transmissivity gradually becomes lower in the outer region than in the inner region, and then develop the mask 210.

Figure 11D:
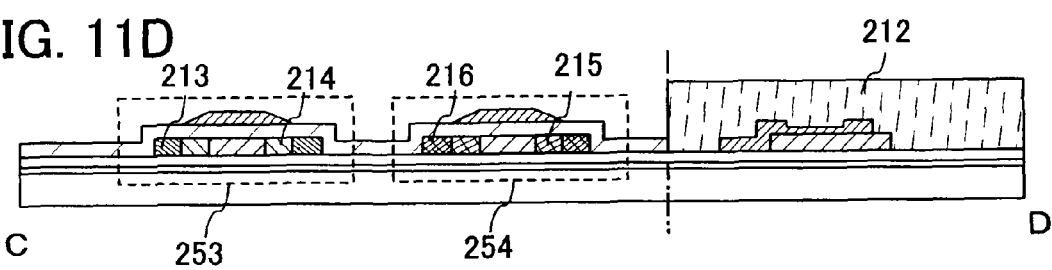

Then, as shown in FIG. 11D, the mask 210 is removed, thereby the conductive layer 208 with a nonuniform thickness can be formed. That is, by using the mask 210, a conductive layer can be processed to have a nonuniform thickness by only one etching process. It is needless to mention that layers other than the conductive layer can be processed by using the mask of the invention.

Then, the silicon layers in the first region 251 are doped with impurity elements by using the conductive layer 208 having tapered edges. A semiconductor element 253 can be formed by using phosphorus (P) as impurity elements which impart n-type conductivity, and a semiconductor element 254 can be formed by using boron (B) as impurity elements which impart p-type conductivity. Note that a thin film transistor (TFT) is used as a semiconductor element. When the silicon layers are doped with impurity elements by using the conductive layer 208 having tapered edges, high concentration impurity regions 213 and 216 can be formed, and also low concentration impurity regions 214 and 215 are formed below the tapered edges.

In addition, silicide may be formed on surfaces of the impurity regions. By forming silicide, source-drain resistance can be lowered. As the source-drain resistance is lowered in this manner, mobility is expected to be improved.

Figure 11E:
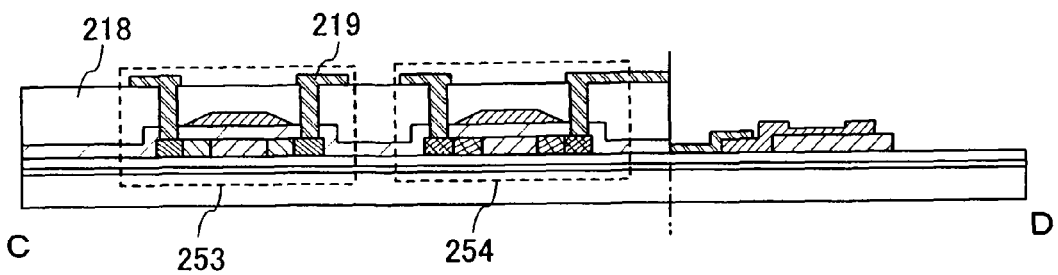

As shown in FIG. 11E, an insulating layer 218 functioning as an interlayer film is formed in the first region 251, so as to cover the conductive layer 208, the insulating layer 206, and the silicon layer 202. The insulating layer 218 can be formed to have either a single-layer structure or a stacked structure, and can be formed by using an insulating inorganic material, an insulating organic material, or the like. As an inorganic material, silicon oxide or silicon nitride can be used. As an organic material, polyimide, acrylic, polyamide, polyimide amide, resist, benzocyclobutene, siloxane, or polysilazane can be used. Note that siloxane is a material having a skeletal structure with a bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Polysilazane is formed by using a polymer material having a bond of silicon (Si) and nitrogen (Ni) as a starting material. Using an inorganic material can prevent intrusion of impurity elements, while using an organic material can increase planarity.

Then, a wire 219 connected to the impurity region is formed. When the wire 219 is connected to a source region, it is called a source wire. Meanwhile, when the wire 219 is connected to a drain region, it is called a drain wire. The wire 219 can be formed by using a film made of an element such as aluminum (Al), titanium (Ti), molybdenum (Mo), tantalum (Ta), tungsten (W), or silicon (Si), or an alloy film containing such elements. The wire 219 can be formed to have either a single-layer structure or a stacked layer. For example, a structure obtained by sequentially stacking a tungsten film, a tungsten nitride film, or the like as a first layer, an aluminum-silicon (Al—Si) alloy film or an aluminum-titanium (Al—Ti) alloy film as a second layer, and a titanium nitride film, a titanium film, or the like as a third layer, can be used. The wire 219 can be manufactured by CVD or sputtering.

The wire 219 can be connected to a cantilever microstructure. Specifically, the wire 219 can be connected to the conductive layer 208 that is a structural layer.

Figure 11F:
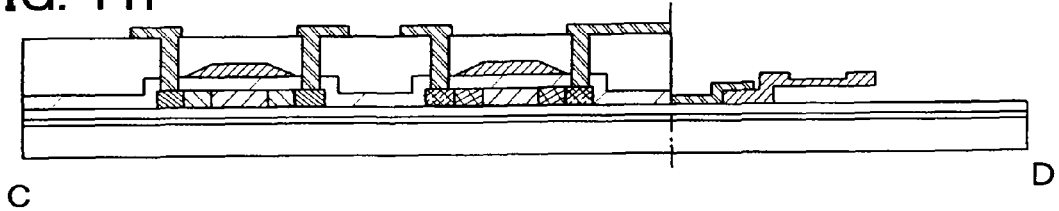

As shown in FIG. 11F, the silicon layer serving as the sacrificial layer 204 is removed. The sacrificial layer can be removed by either wet etching or dry etching. The aforementioned embodiment modes can be referred to for the details thereof.

After that, packaging can be performed as required. For example, a protective film containing nitride of silicon or oxide of silicon can be formed in order to prevent intrusion of moisture and impurity elements into the first region 215.

In this manner, a cantilever microstructure and a semiconductor element for controlling the cantilever microstructure can be formed over the same surface.

Since the cantilever microstructure of the invention can be formed over the same insulating substrate as a semiconductor element, a connection defect between the cantilever microstructure and the semiconductor element can be reduced to increase the mass productivity.

A cantilever microstructure described in this embodiment mode can be used as a probe of an AFM, an acceleration sensor (G sensor), or an angular velocity sensor in addition to a switch.

This embodiment mode can be implemented in combination with the aforementioned embodiment modes as appropriate.

EMBODIMENT MODE 8

This embodiment mode describes a structure for sealing a microstructure.

Figure 17A:
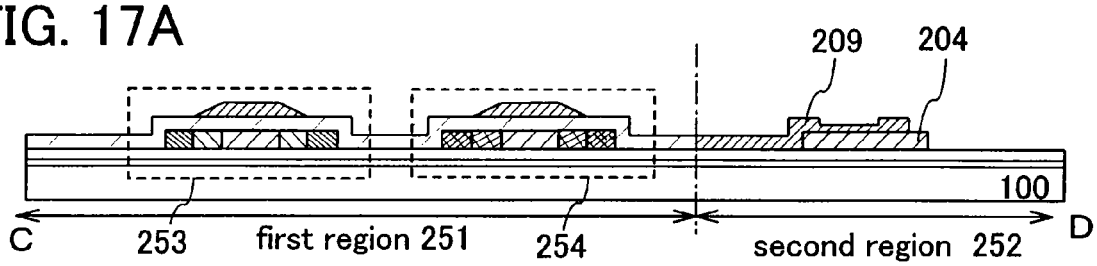
FIGS. 17A to 17E illustrate a manufacturing process of a microstructure of the invention.

As shown in FIG. 17A, the semiconductor elements 253 and 254 are formed over the insulating substrate 100 in the first region 251, and the sacrificial layer 204 and a structural layer 209 are formed over the insulating substrate 100 in the second region 252, similarly to the steps up to the stage shown in FIG. 11D.

Figure 17B:
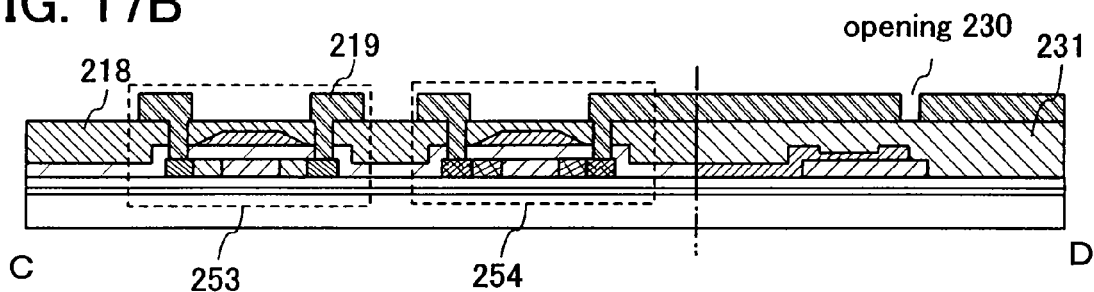

As shown in FIG. 17B, an insulating layer 218 is formed in the first region 251, and an insulating layer 231 is formed in the second region 252. Although the insulating layer 231 and the insulating layer 218 can be manufactured by using a similar material and method, they are formed by using materials which have different etching selectivity with respect to a specific etchant in order to selectively remove only the insulating layer 231. Next, wires 219 connected to the impurity regions are formed across the first region 251 and the second region 252. In this manner, the insulating layer 231 and the wire 219 are formed above the sacrificial layer 204 and the structural layer 209. At this time, the structural layer 209 can be electrically connected to the semiconductor elements 253 and 254. For example, the structural layer 209 is electrically connected to the semiconductor elements 253 and 254 by using the same material as the wire 219.

Then, an opening 230 is formed in the wire 219 in the second region 252. The opening 230 can be formed by either wet etching or dry etching. At this time, an etchant which can selectively remove the wire 219 is used.

Figure 17C:
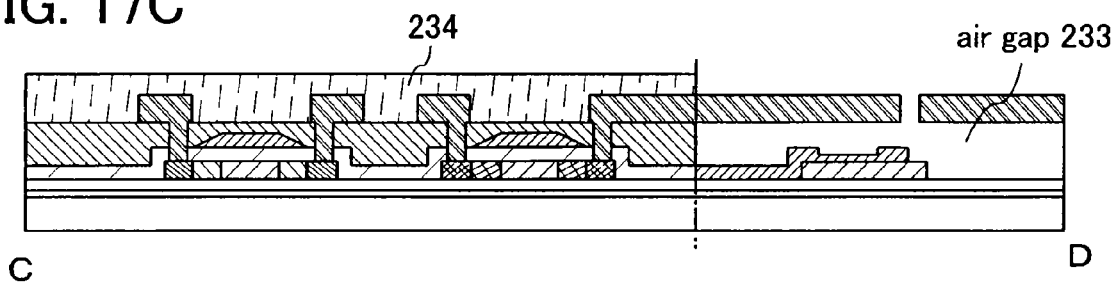

As shown in FIG. 17C, an etchant is introduced from the opening 230 to remove the insulating layer 231. The insulating layer 231 can be removed by either wet etching or dry etching.

At this time, a mask 234 is preferably provided in the first region 251 in order to prevent the insulating layer 218 and the wire 219 from being exposed to the etchant. The mask 234 can be formed by using a similar material and method to the mask 103.

Figure 17D:
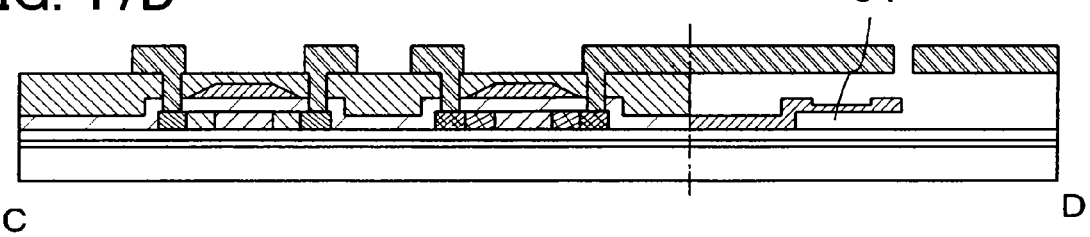

Then, as shown in FIG. 17D, the sacrificial layer 204 is removed. By removing the sacrificial layer 204, an air gap 236 is produced. The sacrificial layer 204 can be removed by either wet etching or dry etching.

The insulating layer 231 and the sacrificial layer 204 may be removed by the same step. For example, the insulating layer 231 and the sacrificial layer 204 can be removed by one step if they are formed from materials which are reactive to the same etchant. By removing the insulating layer 231 and the sacrificial layer 204 through one step, time saving as well as cost reduction can be achieved.

Figure 17E:
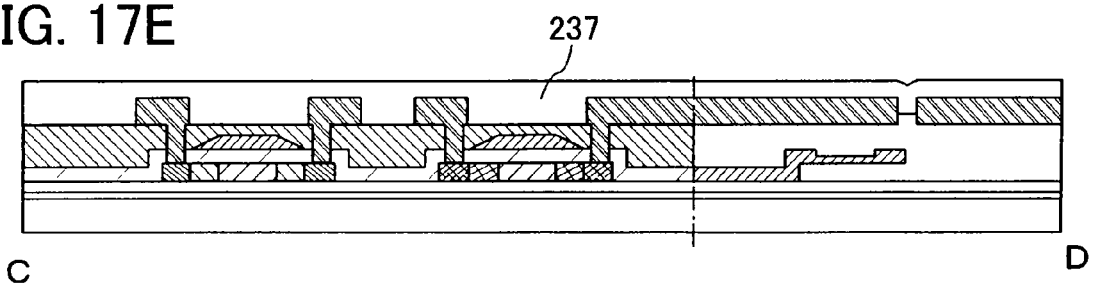

Then, as shown in FIG. 17E, a protective film 237 is formed. The protective film 237 can be manufactured by using the same material and method as the insulating layer 218. Although the protective film 237 can be formed to fill the opening 230, there is no concern that the protective film 237 gets into the air gaps 233 and 236 by forming the opening 230 with a small diameter. In order to fill the air gaps 233 and 236 with an inert gas, the protective film 237 is formed in the inert gas atmosphere. A nitrogen gas can be given as an example of the inert gas.

In this manner, a microstructure and a semiconductor element can be formed over the same substrate, and further, they can be sealed. The microstructure and the semiconductor element which are sealed can be increased in mechanical strength, and thus can be easily carried about. In addition, the microstructure and the semiconductor element which are sealed can be easily handled when they are mounted on another device.

This embodiment mode can be implemented in combination with the aforementioned embodiment modes as appropriate.

EMBODIMENT MODE 9

Although the description has been made of a method for manufacturing a semiconductor element and a microstructure over the same insulating substrate at the same time in the aforementioned embodiment mode, the semiconductor element and the microstructure can be stacked. Thus, this embodiment mode describes a manufacturing method in the case of stacking a microstructure above a semiconductor element.

Figure 20A:
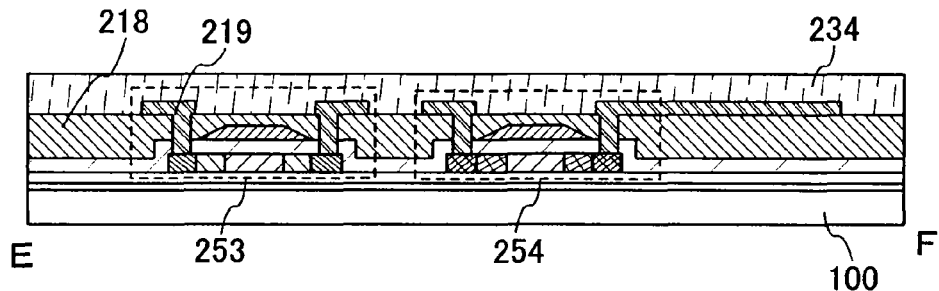
FIGS. 20A to 20E illustrate a manufacturing process of a microstructure of the invention.

As shown in FIG. 20A, the semiconductor elements 253 and 254 are formed over the insulating substrate 100, similarly to the first region 251 in FIG. 11E. Then, the insulating layer 234 is formed so as to cover the insulating layer 218, similarly to FIG. 17C.

Figure 20B:
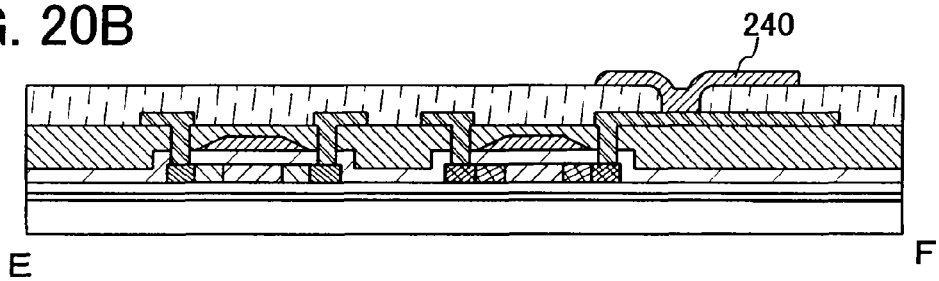

As shown in FIG. 20B, a contact hole is formed in the insulating layer 234, and an electrode 240 connected to the wire 219 is formed. A material and method for forming the electrode 240 are similar to those of the wire 219. The electrode 240 can be used as an electrode for controlling a microstructure.

Figure 20C:
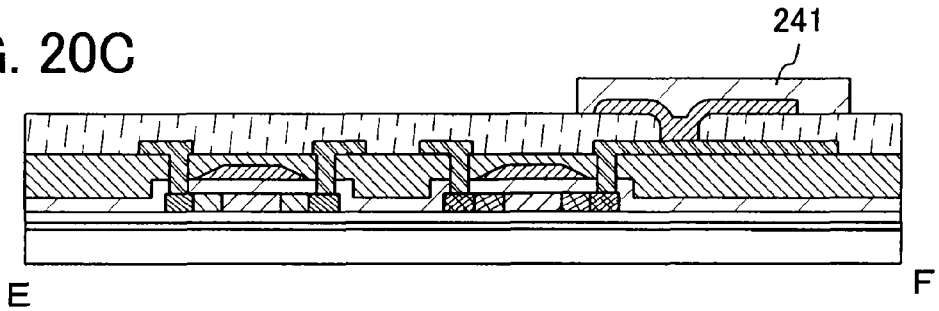

As shown in FIG. 20C, a sacrificial layer 241 is formed so as to cover the electrode 240. The sacrificial layer 241 can be manufactured by using a similar material and method to the sacrificial layer 101.

Figure 20D:
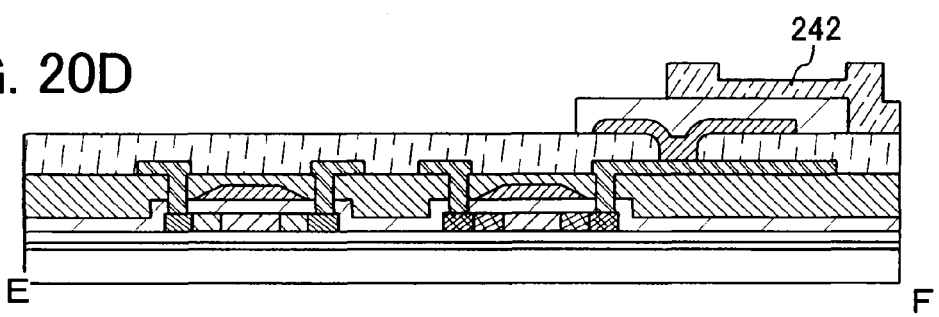

As shown in FIG. 20D, a microstructure 242 is formed to cover at least a part of the sacrificial layer 241. The microstructure 242 can be manufactured by using a similar material and method to the structural layer 209.

Figure 20E:
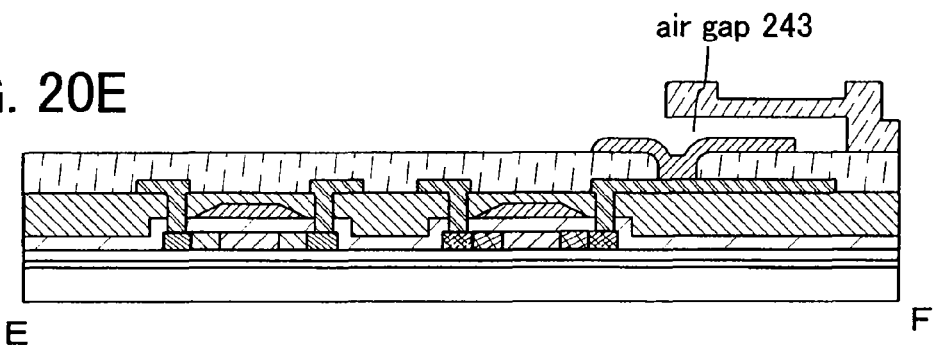

As shown in FIG. 20E, the sacrificial layer 241 is removed. The sacrificial layer 241 can be removed by either wet etching or dry etching. As a result of removing the sacrificial layer 241, an air gap 243 is produced.

In this manner, a semiconductor element and a microstructure can be stacked.

This embodiment mode can be implemented in combination with the aforementioned embodiment modes as appropriate.

EMBODIMENT MODE 10

This embodiment mode describes a method for forming a semiconductor element and a microstructure over the same substrate, where a bottom-gate thin film transistor having a gate electrode below a semiconductor film is used as the semiconductor element.

Similarly to the aforementioned embodiment modes, the insulating substrate 100 is prepared, and a conductive layer is formed thereover. Then, the conductive layer is processed into a predetermined shape to form a gate electrode in the first region 251 and a sacrificial layer in the second region 252.

Then, a silicon layer is formed so as to cover the gate electrode and the sacrificial layer. By processing the silicon layer into a predetermined shape, a semiconductor layer is formed in the first region 251, while a structural layer is formed in the second region 252. The silicon layer can be formed similarly to the aforementioned embodiment modes, and in the case of forming a conductive silicon layer, the silicon layer may be made into silicide or doped with impurities. The structural layer is processed into a rectangular shape such that only one side of the structural layer lies beyond an edge face of the sacrificial layer, while the other side thereof lies not beyond the other edge face of the sacrificial layer, and additionally, the width of the structural layer is narrower than that of the sacrificial layer when seen from the above.

After that, a semiconductor layer containing impurity elements, a source wire, and a drain wire are formed in the first region 251, and a protective film made of silicon oxide or silicon nitride is formed thereover as required. The source wire and the drain wire can be formed similarly to the aforementioned embodiment modes. At this time, the second region 252 is covered with a mask.

The mask in the second region 252 is removed and the sacrificial layer is also removed. At this time, in order to remove the sacrificial layer selectively, if the first region 251 is provided with a mask or covered with a protective film, the mask or the protective film is formed by using a material which can provide etching selectivity with respect to the sacrificial layer.

In this manner, a bottom-gate thin film transistor and a microstructure can be formed over the same surface.

The materials of the sacrificial layer and the structural layer are not limited to a conductive layer and a silicon layer respectively. For example, a bottom electrode may be formed by using a conductive layer serving as a gate electrode, a sacrificial layer may be formed by using a silicon layer, and a structural layer may be formed by using a conductive layer serving as a source wire and a drain wire.

Since the structural layer is formed by using a conductive layer, the microstructure is suitable for a cantilever switch.

EMBODIMENT MODE 11

This embodiment mode describes a mode where a cantilever microstructure and a semiconductor element are transposed onto a resin substrate such as a plastic substrate.

Figure 14A:
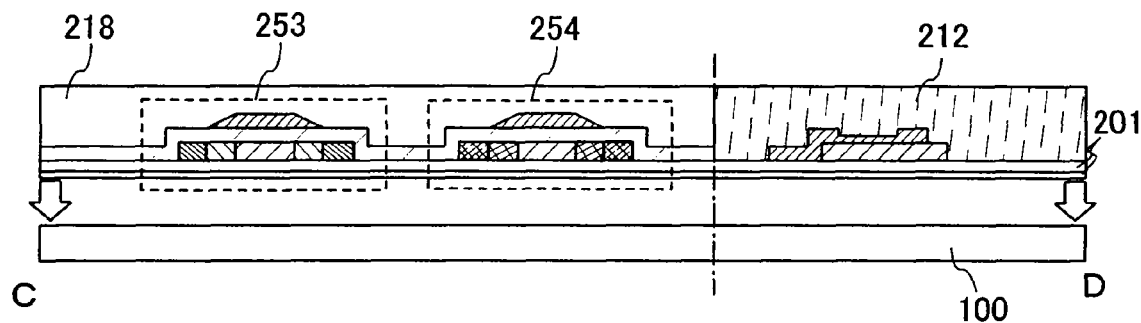
FIGS. 14A to 14C illustrate a manufacturing process of a microstructure of the invention.

As shown in FIG. 14A, the insulating layer 218 is formed through similar steps to the ones shown in the aforementioned embodiment mode. Then, the second region 252 is provided with a mask 212, and the insulating substrate 100 is separated. As a separation method, there is a method by which a separation layer is provided in advance between the insulating substrate 100 and the base layer 201, and the separation layer is physically or chemically removed.

In order to remove the separation layer physically, the crystalline state of the separation layer is controlled to decrease the adhesive strength with respect to the insulating substrate 100, and the insulating substrate 100 is separated with force being applied. As such a separation layer, tungsten oxide or molybdenum oxide can be used, and the crystalline state of the separation layer can be controlled by thermal treatment.

In order to remove the separation layer chemically, an opening which penetrates the separation layer is formed, and an etchant is introduced to remove the separation layer, thereby separating the insulating substrate 100. Such a separation layer may be a silicon layer or a tungsten layer, and the etchant may be halogen fluoride such as chlorine trifluoride ($ClF_3$), nitrogen trifluoride ($NF_3$), bromine trifluoride ($BrF_3$), or hydrogen fluoride (HF).

It is needless to mention that a physical method and a chemical method may be combined.

Figure 14B:
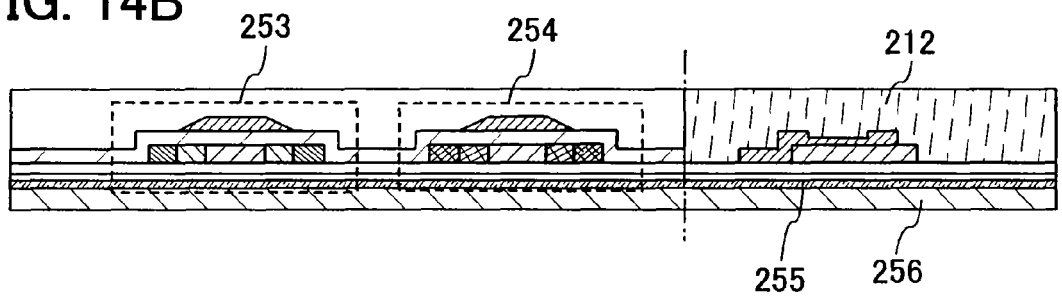

As shown in FIG. 14B, a resin substrate 256 such as a plastic substrate is attached to the base layer 201 using an adhesive layer 255. The adhesive layer 255 can be formed by using an ultraviolet curable resin, heat curable rein, or the like.

Figure 14C:
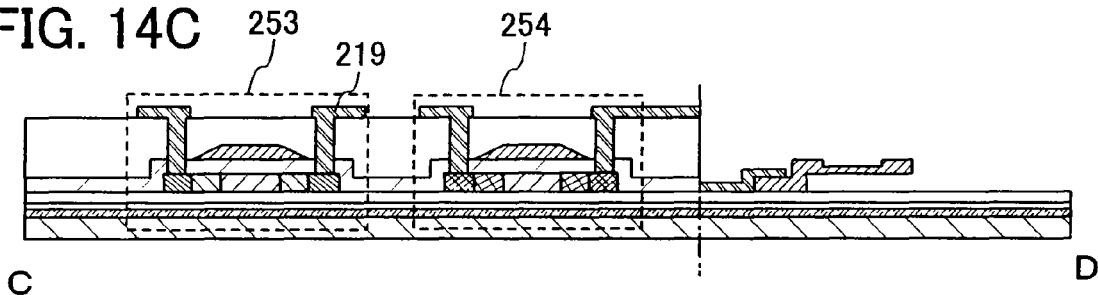

As shown in FIG. 14C, the mask 212 is removed similarly to the aforementioned embodiment modes, the wire 219 is formed, and then a silicon layer serving as the sacrificial layer 204 is removed.

In this manner, a cantilever microstructure and a semiconductor element which are transposed to a resin substrate can be formed. By transposing a cantilever microstructure and a semiconductor element to a resin substrate, further reduction in weight and thickness can be achieved.

This embodiment mode can be implemented in combination with the aforementioned embodiment modes as appropriate.

EMBODIMENT MODE 12

Conventionally, in order to handle a very small object with a size of a few millimeters or less, the following process has been necessary: magnify a structure of a very small object; process the information of the object by humans or computers and determine the operation to be delivered to the object; and scale down the operation to be transmitted to the object.

However, a cantilever microstructure of the invention can handle a very small object only by receiving an instruction with a broader concept from humans or computers. That is, when humans or computers determine a target and transmit an instruction to a cantilever microstructure, the cantilever microstructure obtains information of the object by using a sensor or the like, and processes the information to take action. Note that a "very small object" described herein includes, for example, an object which has a size of several meters, but emits weak signals (which include small changes of light or pressure, for example), and the like.

A cantilever microstructure of the invention belongs to the field of micromachines, and can have a size of from micro meters to millimeters. In the case where the cantilever microstructure of the invention is manufactured to be incorporated as a component of a mechanical device, the cantilever microstructure may have a size of several meters so that it can be easily assembled.

This embodiment mode describes a configuration example of the aforementioned cantilever microstructure, with reference to the block diagram.

Figure 9:
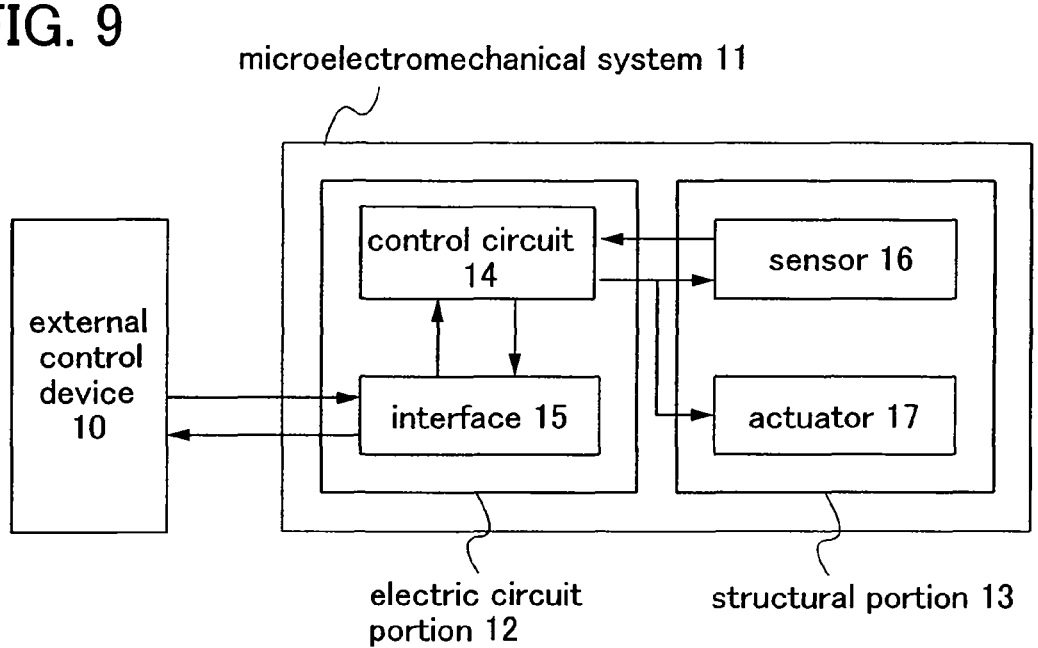
FIG. 9 is a block diagram illustrating a microelectromechanical system of the invention.

FIG. 9 shows a schematic diagram of a microelectromechanical system having a cantilever microstructure. A microelectromechanical system 11 of the invention includes an electric circuit portion 12 having a semiconductor element and a structural portion 13 having a microstructure. The electric circuit portion 12 includes a control circuit 14 for controlling the microstructure, an interface 15 which communicates with an external control device 10, and the like. The structural portion 13 includes a microstructure such as a sensor 16, an actuator 17, and a switch. The actuator means a component part which converts signals (mainly electric signals) into physical quantities.

The electric circuit portion 12 may include a central processing unit and the like in order to process the information obtained by the structural portion 13.

The external control device 10 performs the following operation: transmit signals for controlling the microelectromechanical system 11; receive the information obtained by the microelectromechanical system 11; supply power for driving the microelectromechanical system 11; and the like.

According to a feature of the invention, a cantilever microstructure incorporates a microstructure and an electric circuit which includes a semiconductor element and controls the microstructure. The other structures are not limited to the ones shown in FIG. 9.

EMBODIMENT MODE 13

This embodiment mode describes a device to which a switch having a microstructure is applied. When a switch of the invention is combined with a conducting pathway, a phase shifter can be formed. Such a phase shifter can be mounted on a portable phone set.

Figure 21:
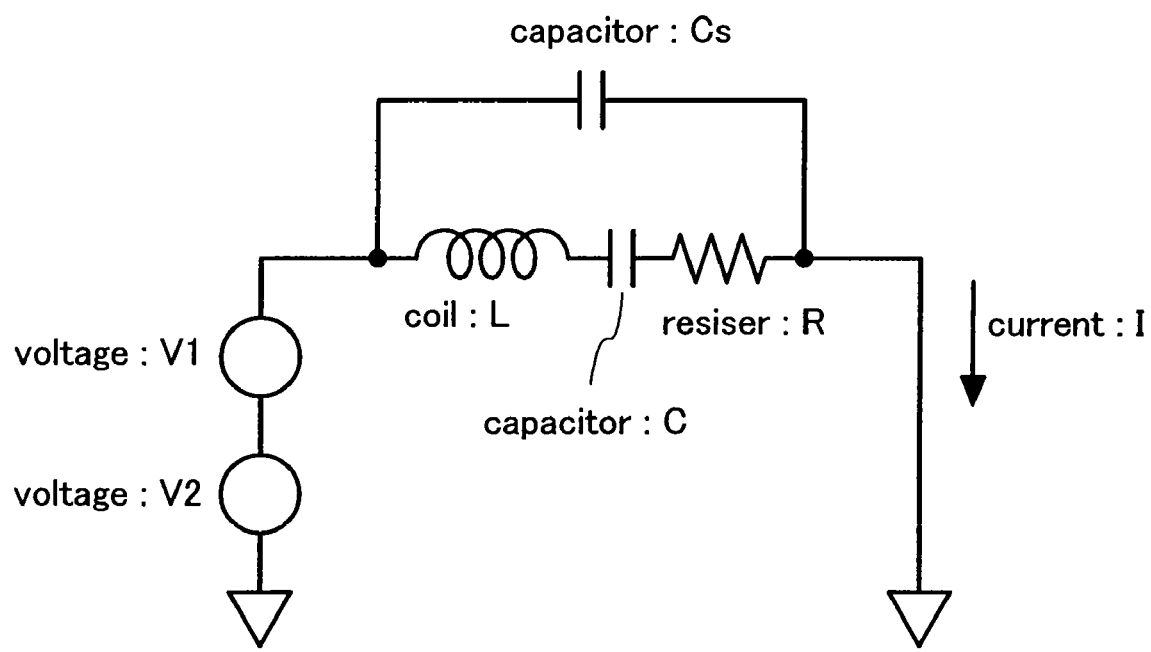
FIG. 21 is a circuit diagram of a resonator to which a microstructure of the invention is applied.

In addition, a resonator can be manufactured by using the cantilever microstructure of the invention. FIG. 21 shows a circuit diagram of a resonator. In the resonator, a coil: L, a capacitor: C and a resistor: R are connected in series, and a capacitor Cs1 is provided between them. In addition, a capacitor Cs2 is provided to be connected at each end of the coil: L and the resistor: R.

The switch of the invention can be applied to such a phase shifter and a resonator.

The present application is based on Japanese Priority application No. 2005-232670 filed on Aug. 10, 2005 with the Japanese Patent Office, the entire contents of which are hereby incorporated by reference.

What is claimed is:

1. A manufacturing method of a microelectromechanical system, comprising the steps of:
    forming a sacrificial layer;
    forming a first layer over the sacrificial layer;
    forming a mask having a first portion having a first thickness and a second portion having a second thickness over the first layer;
    etching the first layer by using the mask to form a structural layer having a shape of a cantilever so that a portion of the structural layer provided below the second portion of the mask is thinner than a portion of the structural layer provided below the first portion of the mask; and
    removing the sacrificial layer provided below the structural layer.

2. The manufacturing method of a microelectromechanical system according to claim 1, wherein a portion of the structural layer provided below the first portion of the mask with the first thickness functions as a weight.

3. A manufacturing method of a microelectromechanical system, comprising the steps of:
    forming a sacrificial layer;
    forming an amorphous silicon layer over the sacrificial layer;
    forming a polycrystalline silicon layer by crystallizing the amorphous silicon layer using a metal;
    forming a mask having a first portion having a first thickness and a second portion having a second thickness over the polycrystalline silicon layer;
    etching the polycrystalline silicon layer by using the mask to form a structural layer having a shape of a cantilever so that a portion of the structural layer provided below the second portion of the mask is thinner than a portion of the structural layer provided below the first portion of the mask; and
    removing the sacrificial layer provided below the structural layer.

4. The manufacturing method of a microelectromechanical system according to claim 3, wherein a portion of the structural layer provided below the first portion of the mask with the first thickness functions as a weight.

5. A manufacturing method of a microelectromechanical system, comprising the steps of:
    forming an amorphous silicon layer;
    forming a polycrystalline silicon layer as a sacrificial layer by crystallizing the amorphous silicon layer using a metal;
    forming a first layer over the sacrificial layer;
    forming a mask having a first portion having a first thickness and a second portion having a second thickness over the first layer;
    etching the first layer by using the mask to form a structural layer having a shape of a cantilever so that a portion of the structural layer provided below the second portion of the mask is thinner than a portion of the structural layer provided below the first portion of the mask; and
    removing the sacrificial layer provided below the structural layer.

6. The manufacturing method of a microelectromechanical system according to claim 5, wherein a portion of the structural layer provided below the first portion of the mask with the first thickness functions as a weight.

7. The manufacturing method of a microelectromechanical system, according to any one of claims 1, 3 and 5, wherein the second portion of the mask is thinner than the first portion of the mask.

8. The manufacturing method of a microelectromechanical system, according to any one of claims 1, 3 and 5, wherein the second portion of the mask is formed by using a photomask or a reticle having an auxiliary pattern which is formed of a diffraction grating pattern or a semi-transmissive film having a function of reducing a light intensity.

9. The manufacturing method of a microelectromechanical system, according to any one of claims 1, 3 and 5,
    wherein the first portion of the mask is formed by using a photomask or a reticle having a mask pattern with a uniform thickness; and
    wherein the second portion of the mask is formed by using a photomask or a reticle having a mask pattern which is deliberately formed to have a nonuniform thickness.

10. A manufacturing method of a microelectromechanical system, comprising the steps of:
    forming a semiconductor layer to be a semiconductor element over a first region of an insulating substrate;
    forming a sacrificial layer over a second region of the insulating substrate;
    forming a conductive layer over the semiconductor layer and the sacrificial layer;
    forming a first mask and a second mask, wherein each of the first mask and the second mask has a first portion having a first thickness and a second portion having a second thickness over the conductive layer;
    etching the conductive layer by using the first mask and the second mask, thereby forming a gate electrode of the semiconductor element in the first region and forming a structural layer having a shape of a cantilever in the second region so that in the structural layer formed in the second region, a portion of the conductive layer provided below the second portion of the first mask is thinner than a portion of the conductive layer provided below the first portion of the first mask;
    forming an impurity region in the semiconductor layer by using the gate electrode;
    forming a wire connected to the impurity region and the structural layer; and
    removing the sacrificial layer provided below the conductive layer in the second region.

11. The manufacturing method of a microelectromechanical system according to claim 10, wherein the portion of the conductive layer provided below the first portion of the first mask functions as a weight.

12. The manufacturing method of a microelectromechanical system according to claim 10,
    wherein the second thickness of the first mask is thinner than the first thickness of the first mask; and
    wherein the second thickness of the second mask is thinner than the first thickness of the second mask.

13. The manufacturing method of a microelectromechanical system according to claim 10, wherein each of the second portion of the first mask and the second portion of the second mask is formed by using a photomask or a reticle having an auxiliary pattern which is formed of a diffraction grating pattern or a semi-transmissive film having a function of reducing a light intensity.

14. The manufacturing method of a microelectromechanical system according to claim 10,
  wherein each of the first portion of the first mask with the first thickness and the second portion of the second mask is formed by using a photomask or a reticle having a mask pattern with a uniform thickness; and
  wherein each of a portion of the first mask with the second thickness and a portion of the second mask with the second thickness is formed by using a photomask or a reticle having a mask pattern which is deliberately formed to have a nonuniform thickness.

15. The manufacturing method of a micro electromechanical system, according to claim 3, wherein the mask with the second thickness is thinner than the mask with the first thickness.

16. The manufacturing method of a microelectromechanical system, according to claim 5,
  wherein the mask with the second thickness is thinner than the mask with the first thickness.

17. The manufacturing method of a microelectromechanical system, according to claim 3,
  wherein the mask with the second thickness is formed by using a photomask or a reticle having an auxiliary pattern which is formed of a diffraction grating pattern or a semi-transmissive film having a function of reducing the light intensity.

18. The manufacturing method of a microelectromechanical system, according to claim 5,
  wherein the mask with the second thickness is formed by using a photomask or a reticle having an auxiliary pattern which is formed of a diffraction grating pattern or a semi-transmissive film having a function of reducing the light intensity.

19. The manufacturing method of a micro electromechanical system, according to claim 3,
  wherein the mask with the first thickness is formed by using a photomask or a reticle having a mask pattern with a uniform thickness; and
  wherein the mask with the second thickness is formed by using a photomask or a reticle having a mask pattern which is deliberately formed to have a nonuniform thickness.

20. The manufacturing method of a microelectromechanical system, according to claim 5,
  wherein the mask with the first thickness is formed by using a photomask or a reticle having a mask pattern with a uniform thickness; and
  wherein the mask with the second thickness is formed by using a photomask or a reticle having a mask pattern which is deliberately formed to have a nonuniform thickness.

* * * * *

UNITED STATES PATENT AND TRADEMARK OFFICE
CERTIFICATE OF CORRECTION

| | | |
|---|---|---|
| PATENT NO. | : 7,875,483 B2 | Page 1 of 1 |
| APPLICATION NO. | : 11/462225 | |
| DATED | : January 25, 2011 | |
| INVENTOR(S) | : Konami Izumi et al. | |

It is certified that error appears in the above-identified patent and that said Letters Patent is hereby corrected as shown below:

Column 25, line 4, replace "second portion" with --first portion--

Column 25, line 4, insert --with the first thickness-- after "mask"

Column 25, line 7, replace "a portion" with --the second portion--

Column 25, line 8, replace "a portion" with --the second portion--

Signed and Sealed this
Third Day of April, 2012

David J. Kappos
*Director of the United States Patent and Trademark Office*